US010132887B2

(12) United States Patent
Rapoport

(10) Patent No.: US 10,132,887 B2
(45) Date of Patent: Nov. 20, 2018

(54) MRI THERMO-ISOLATING JACKET

(71) Applicant: ASPECT IMAGING LTD., Shoham (IL)

(72) Inventor: Uri Rapoport, Moshav Ben Shemen (IL)

(73) Assignee: ASPECT IMAGING LTD., Shoham (IL)

( * ) Notice: Subject to any disclaimer, the term of this patent is extended or adjusted under 35 U.S.C. 154(b) by 872 days.

(21) Appl. No.: 14/623,039

(22) Filed: Feb. 16, 2015

(65) Prior Publication Data
US 2015/0253400 A1    Sep. 10, 2015

Related U.S. Application Data

(60) Provisional application No. 61/950,132, filed on Mar. 9, 2014.

(30) Foreign Application Priority Data

Mar. 11, 2014   (DE) .................... 20 2014 101 104 U

(51) Int. Cl.
*G01R 33/38* (2006.01)
*G01R 33/422* (2006.01)

(52) U.S. Cl.
CPC ....... *G01R 33/3804* (2013.01); *G01R 33/422* (2013.01); *Y10T 29/49826* (2015.01)

(58) Field of Classification Search
CPC .............. G01R 33/3804; G01R 33/422; Y10T 29/49826
USPC .................................................. 324/239, 318
See application file for complete search history.

(56) References Cited

U.S. PATENT DOCUMENTS

| 3,504,932 | A | 4/1970 | Carlson |
| 3,534,251 | A | 10/1970 | Richards |
| 4,910,461 | A | 3/1990 | Van Vaals |
| 4,977,585 | A | 12/1990 | Boyd |
| 5,028,872 | A | 7/1991 | Nakabayashi |
| 5,039,826 | A | 8/1991 | Newland |
| 5,065,760 | A | 11/1991 | Krause et al. |

(Continued)

FOREIGN PATENT DOCUMENTS

| DE | 202013105276 | 2/2014 |
| EP | 0825450 | 8/1997 |

(Continued)

OTHER PUBLICATIONS

Maramraju, Sri Harsha, et al. Electromagnetic interactions in a shielded PET/MRI system for simultaneous PET/MRI imaging in 9.4 T: evaluation and results, IEEE Transactions on Nuclear Science 59, 5 (2012): pp. 1892-1896.

(Continued)

*Primary Examiner* — Farhana Hoque
(74) *Attorney, Agent, or Firm* — Pearl Cohen Zedek Latzer Baratz LLP

(57) ABSTRACT

A thermo-isolating jacket for a magnetic resonance device (MRD). The thermo-isolating jacket is configured to be positioned in an atmospheric pressure, temperature changing environment. The thermo-isolating jacket provides a passive temperature insulating device to be placed on the outer side of the MRD. The thermo-isolating jacket insulates the MRD from external environment temperature fluctuations during its operation.

7 Claims, 14 Drawing Sheets

(56) References Cited

U.S. PATENT DOCUMENTS

| | | | |
|---|---|---|---|
| 5,159,929 A | 11/1992 | Morris et al. | |
| 5,243,286 A | 9/1993 | Rzedzian et al. | |
| 5,305,749 A | 4/1994 | Li et al. | |
| 5,572,131 A | 11/1996 | Rzedzian | |
| 5,594,200 A | 1/1997 | Ramsey | |
| 5,635,889 A | 6/1997 | Stelter | |
| 5,986,531 A | 11/1999 | Carrozzi | |
| RE36,679 E | 5/2000 | Zakhor et al. | |
| 6,215,309 B1 | 4/2001 | Rzedzian et al. | |
| 6,346,814 B1 | 2/2002 | Carrozzi et al. | |
| 6,546,814 B1 | 4/2003 | Choe et al. | |
| 6,711,430 B1 | 3/2004 | Ferris et al. | |
| 6,801,038 B2 | 10/2004 | Carrozzi et al. | |
| 6,873,156 B2 | 3/2005 | Ferris et al. | |
| 6,995,562 B2 | 2/2006 | Laskaris et al. | |
| 7,141,974 B2 | 11/2006 | Edelstein et al. | |
| 7,157,911 B2 | 1/2007 | Suzuki et al. | |
| 7,171,256 B1 | 1/2007 | Graessle et al. | |
| 7,375,526 B2 | 5/2008 | Edelstein et al. | |
| 7,529,575 B2 | 5/2009 | Rezzonico et al. | |
| 7,633,294 B2 | 12/2009 | Leussler et al. | |
| 7,715,895 B1 | 5/2010 | Graessle et al. | |
| 7,772,503 B2 | 8/2010 | Ginanneschi | |
| 7,801,613 B2 | 9/2010 | Li et al. | |
| 8,807,084 B2 | 8/2014 | Rapoport et al. | |
| 8,851,018 B2 | 10/2014 | Rapoport et al. | |
| 8,896,310 B2 | 11/2014 | Rapoport | |
| 9,301,724 B2 | 4/2016 | McKnight et al. | |
| 9,498,167 B2 | 11/2016 | Mostafavi et al. | |
| 9,562,956 B2 | 2/2017 | Rapoport | |
| 2002/0057088 A1 | 5/2002 | Carrozzi et al. | |
| 2003/0016518 A1 | 1/2003 | Arz | |
| 2003/0058502 A1 | 3/2003 | Griffiths et al. | |
| 2003/0088175 A1 | 5/2003 | Branch et al. | |
| 2005/0046422 A1 | 3/2005 | Edelstein et al. | |
| 2005/0049491 A1 | 3/2005 | Rezzonico et al. | |
| 2007/0026733 A1 | 2/2007 | Greim et al. | |
| 2007/0135704 A1 | 6/2007 | Branch et al. | |
| 2007/0232894 A1 | 10/2007 | Feenan | |
| 2008/0060843 A1 | 3/2008 | Ginanneschi | |
| 2008/0094062 A1 | 4/2008 | Edelstein et al. | |
| 2008/0186026 A1 | 8/2008 | Leussler et al. | |
| 2010/0000780 A1 | 1/2010 | Zhu et al. | |
| 2011/0162652 A1 | 3/2011 | Rapoport | |
| 2011/0186049 A1 | 3/2011 | Rapoport | |
| 2011/0234347 A1 | 9/2011 | Rapoport | |
| 2011/0304333 A1 | 12/2011 | Rapoport | |
| 2012/0046722 A1 | 2/2012 | Olsen et al. | |
| 2012/0071745 A1 | 3/2012 | Rapoport | |
| 2012/0073511 A1 | 3/2012 | Rapoport et al. | |
| 2012/0077707 A1 | 3/2012 | Rapoport | |
| 2012/0118630 A1 | 5/2012 | Jiang et al. | |
| 2012/0119742 A1* | 5/2012 | Rapoport | G01R 33/3802 324/318 |
| 2013/0079624 A1 | 3/2013 | Rapoport | |
| 2013/0109956 A1 | 5/2013 | Rapoport | |
| 2013/0237803 A1 | 5/2013 | Rapoport | |
| 2013/0229181 A1 | 9/2013 | Biber et al. | |
| 2013/0328559 A1 | 12/2013 | Rapoport | |
| 2013/0328560 A1 | 12/2013 | Rapoport | |
| 2013/0328563 A1 | 12/2013 | Rapoport | |
| 2014/0050827 A1 | 2/2014 | Rapoport | |
| 2014/0051973 A1 | 2/2014 | Rapoport et al. | |
| 2014/0051974 A1 | 2/2014 | Rapoport et al. | |
| 2014/0051976 A1 | 2/2014 | Rapoport et al. | |
| 2014/0099010 A1 | 4/2014 | Rapoport | |
| 2014/0103927 A1 | 4/2014 | Rapoport | |
| 2014/0117989 A1 | 5/2014 | Rapoport | |
| 2014/0128725 A1 | 5/2014 | Rapoport | |
| 2014/0139216 A1 | 5/2014 | Rapoport | |
| 2014/0142914 A1 | 5/2014 | Rapoport | |
| 2014/0152302 A1 | 6/2014 | Rapoport et al. | |
| 2014/0152310 A1 | 6/2014 | Rapoport | |
| 2014/0158062 A1 | 6/2014 | Rapoport et al. | |
| 2014/0230850 A1 | 8/2014 | Rapoport | |
| 2014/0257081 A1 | 9/2014 | Rapoport | |
| 2014/0266203 A1 | 9/2014 | Rapoport | |
| 2014/0300358 A1 | 10/2014 | Rapoport | |
| 2014/0354279 A1 | 12/2014 | Dumoulin et al. | |
| 2014/0364722 A1 | 12/2014 | Dumoulin | |
| 2014/0378821 A1 | 12/2014 | Rapoport et al. | |
| 2014/0378825 A1 | 12/2014 | Rapoport et al. | |
| 2015/0059655 A1 | 3/2015 | Rapoport | |
| 2015/0065788 A1 | 3/2015 | Rapoport | |
| 2015/0112186 A1 | 4/2015 | Rapoport et al. | |
| 2015/0137812 A1 | 5/2015 | Rapoport | |
| 2015/0141799 A1 | 5/2015 | Rapoport et al. | |
| 2015/0168519 A1 | 6/2015 | Rapoport | |
| 2015/0208994 A1 | 7/2015 | Rapoport | |
| 2015/0212172 A1 | 7/2015 | Rapoport | |
| 2015/0212173 A1 | 7/2015 | Rapoport | |
| 2015/0253400 A1 | 9/2015 | Rapoport | |
| 2015/0253401 A1 | 9/2015 | Rapoport | |
| 2017/0146619 A1 | 5/2017 | Strauss et al. | |
| 2017/0256853 A1 | 9/2017 | Anderson et al. | |

FOREIGN PATENT DOCUMENTS

| | | |
|---|---|---|
| JP | 62207448 | 9/1987 |
| JP | 2005270422 | 10/2005 |
| WO | 20000016116 A1 | 3/2000 |
| WO | WO2015071906 | 5/2015 |

OTHER PUBLICATIONS

Aspect Imaging Ltd., "Shutting Assembly for Closing an Entrance of an MRI Device", co-pending U.S. Appl. No. 14/540,163, filed Nov. 13, 2014.

Aspect Imaging Ltd, "MRI—Incubator's Closure Assembly", co-pending U.S. Appl. No. 14/539,442, filed Nov. 12, 2014.

Aspect Imaging Ltd., "Cage in an MRD with a Fastening/Attenuating System", co-pending U.S. Appl. No. 14/527,950, filed Oct. 30, 2014.

Rapoport, Uri, "RF Shielding Conduit in an MRI Closure Assembly", co-pending U.S. Appl. No. 14/574,785, filed Dec. 18, 2014.

Aspect Imaging Ltd., "System and Method for Generating Invasively Hyperpolarized Images", co-pending U.S. Appl. No. 14/556,682, filed Dec. 1, 2014.

Aspect Imaging Ltd., "System and Method for Generating Invasively Hyperpolarized Images", co-pending U.S. Appl. No. 14/556,654, filed Dec. 1, 2014.

Aspect Imaging Ltd., "MRI with Magnet Assembly Adapted for Convenient Scanning of Laboratory Animals with Automated RF Tuning Unit", co-pending U.S. Appl. No. 14/581,266, filed Dec. 23, 2014.

Aspect Imaging Ltd., "Chamber for Housing Animals During Anaesthetic Procedures", co-pending U.S. Appl. No. 14/537,266, filed Nov. 10, 2014.

Aspect Imaging Ltd., "RF Automated Tuning System Used in a Magnetic Resonance Device and Methods Thereof", co-pending U.S. Appl. No. 14/588,741, filed Jan. 2, 2015.

Aspect Imaging Ltd., "Means for Operating an MRI Device Within a RF-Magnetic Environment", co-pending U.S. Appl. No. 14/596,320, filed Jan. 14, 2015.

Aspect Imaging Ltd., "Means and Method for Operating an MRI Device Within a RF-Magnetic Environment", co-pending U.S. Appl. No. 14/596,329, filed Jan. 14, 2015.

Aspect Imaging Ltd., "CT/MRI Integrated System for the Diagnosis of Acute Strokes and Methods Thereof", co-pending U.S. Appl. No. 14/598,517, filed Jan. 16, 2015.

Aspect Imaging Ltd., "Mechanical Clutch for MRI", co-pending U.S. Appl. No. 14/611,379, filed Feb. 2, 2015.

Aspect Imaging Ltd., "Method for Providing High Resolution, High Contrast Fused MRI Images", co-pending U.S. Appl. No. 13/877,533, filed May 22, 2014.

Aspect Imaging Ltd., "Method for Manipulating the MRI's Protocol of Pulse-Sequences", co-pending U.S. Appl. No. 14/070,695, filed Nov. 4, 2013.

(56) References Cited

OTHER PUBLICATIONS

Aspect Imaging Ltd., "Foamed Patient Transport Incubator", co-pending U.S. Appl. No. 14/531,289, filed Nov. 3, 2014.
Aspect Imaging Ltd., "Incubator Deployable Multi-Functional Panel", co-pending U.S. Appl. No. 14/619,557, filed Feb. 11, 2015.
Aspect Imaging Ltd., "MRI Thermo-Isolating Jacket", co-pending U.S. Appl. No. 14/623,039, filed Feb. 16, 2015.
Aspect Imaging Ltd., "MRI RF Shielding Jacket", co-pending U.S. Appl. No. 14/623,051, filed Feb. 16, 2015.
Aspect Imaging Ltd., "Capsule for a Pneumatic Sample Feedway", co-pending U.S. Appl. No. 14/626,391, filed Feb. 19, 2015.
Aspect Imaging Ltd., "Incubator's Canopy with Sensor Dependent Variably Transparent Walls and Methods for Dimming Lights Thereof", co-pending U.S. Appl. No. 14/453,309, filed Aug. 7, 2014.
Aspect Imaging Ltd., "Temperature-Controlled Exchangeable NMR Probe Cassette and Methods Thereof", co-pending U.S. Appl. No. 14/504,890, filed Oct. 2, 2014
Aspect Imaging Ltd., "NMR Extractable Probe Cassette Means and Methods Thereof", co-pending U.S. Appl. No. 14/504,907, filed Oct. 2, 2014.

\* cited by examiner

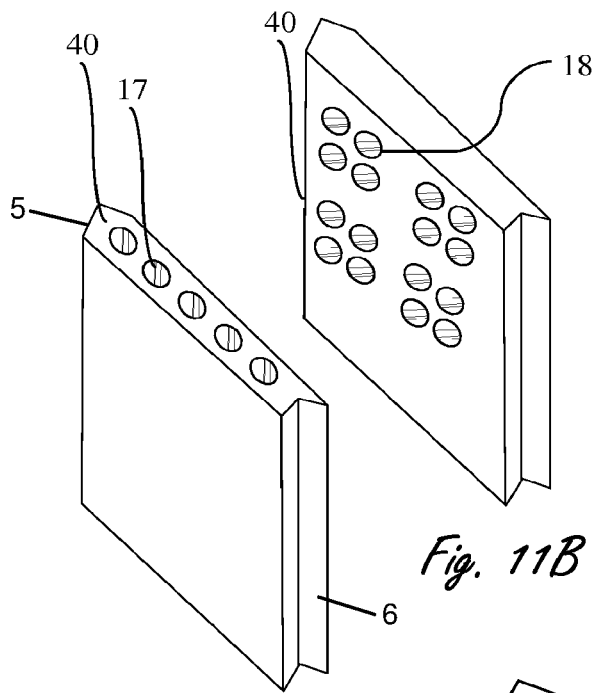
Fig. 11A
Fig. 11B
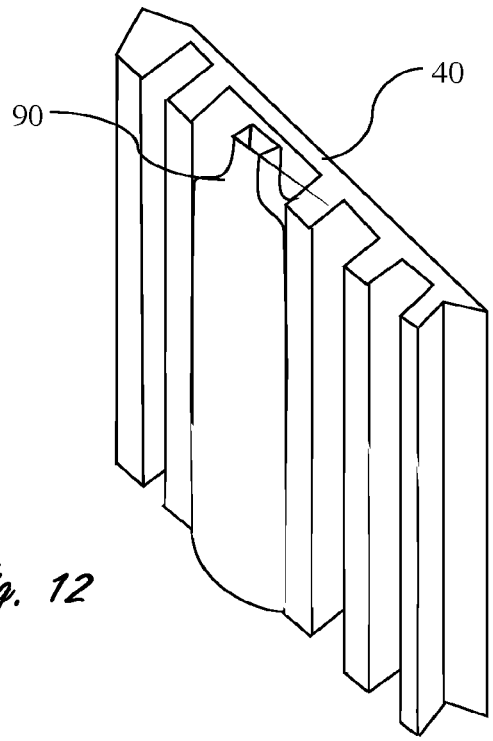
Fig. 12

MRI THERMO-ISOLATING JACKET

This application claims priority to U.S. Provisional Application No. 62/950,132 filed on Mar. 9, 2014; and to German Patent Application 202014101104.8 filed on Mar. 11, 2014; which are incorporated herein by reference is their entirety.

FIELD OF THE INVENTION

The present invention generally relates to the field of magnetic resonance imaging systems (MRI), and more particularly, to an MRI thermo-isolating jacket, for thermo insulating the MRI from the external environment temperature during its operation and methods thereof.

BACKGROUND OF THE INVENTION

MRI technology utilizes magnetism and radio frequency for imaging of patients for medical diagnosis and research. Magnetic resonance imaging device (MRD) design is essentially determined by the type and format of the main magnet, i.e. closed, tunnel-type MRI or open MRI.

In general, three main types of magnets are used in MRI systems: resistive, permanent and superconducting. The most commonly used magnets are superconducting electromagnets. These consist of a coil that has been made superconductive by helium liquid cooling, and further maintained cold by a cryocooler, refrigerator, or liquid nitrogen. Superconducting electromagnets produce strong, homogeneous magnetic fields, but are expensive and require regular maintenance.

Additionally, three gradient MRI magnets are used in the MRI machine to help the imaging process. They are very weak magnets, unlike the others in the system. They create a variable field after the other magnets have been activated and generated a stable field, and are turned on and off very quickly to create different pictures or "slices" for a more thorough and in-depth examination of the patient.

Low field MRI also uses resistive electromagnets, able to create a magnetic field when electricity runs through them. They are cheaper and easier to maintain than superconducting magnets. Resistive electromagnets are far less powerful, use more energy and require a cooling system. Other magnets in use are permanent magnets, of different formats, that are composed of ferromagnetic metallic components. Although they have the advantage of being inexpensive and easy to maintain, they are very heavy and weak in intensity.

Maintaining a uniform and stable magnetic field is a necessity for producing quality imaging. Among the factors affecting this field are temperature, electromagnetic interference, and movement. When referring to small magnetic resonance devices (MRD) the magnet used is usually a permanent magnet. Since a permanent magnet does not produce heat, and being rather small in size the device's heat retention capabilities are low, the MRD is exposed to the environment temperature. Further, being small in size, thus transportable, requires that the MRD will be able to work in different environmental conditions.

Having a large signal to noise ratio (SNR), the MRD needs to be as un-interrupted as possible during the examination. Temperature changes can result in interference in the uniformity of the magnetic field. An MRI scan in a non-uniform magnetic field, results in either artifacts or missed information. Obtaining best results from an MRI scan, and thereby increasing the efficiency of the imaging process requires homogeneity of conditions. As MRI technology is also used for temperature mapping, stabilizing the temperature in which the MRD operates is of importance. Homogeneity of the MRI scanning conditions also enables reliable comparison of MRI scans taken at different times from the same individual or sample, allowing for better monitoring of small changes.

Kruip WO 2000/016116 discloses a mean for stabilization of a magnetic field of a magnetic resonance imaging (MRI) apparatus, generated by permanent magnets, against variation of temperature due to operation of gradient coils. A thermo-conductive plate is positioned between the gradient coils and the permanent magnet, further connected to a temperature sensor and to a plurality of heat pumping devices. However, the system described is an active system, positioned within a magnetic resonance device, and not compatible for small magnetic resonance devices. Moreover, the system describes a mean to maintain temperature change as a result of the operation of the gradient coils and not efficiently built for maintaining temperature changes originating from the external environment. Further, the system described maintains only the heat of the magnet and not the overall temperature of the MRD as a whole. The invention described uses only heat pumping devices and does not utilize any passive temperature regulating systems.

Therefore, there is a need for a passive thermo-regulating assembly providing insulation of the MRD from the external environment, thereby allowing for homogenized imaging conditions. The present invention provides a passive temperature insulating device, placed on the outer side of an MRD, the system is fitting for existing MRDs as well as newly designed ones.

SUMMARY OF THE INVENTION

The present invention provides a thermal isolating jacket for a magnetic resonance device (MRD), configured to be positioned in an atmospheric pressure system, temperature changing environment, having at least one first temperature $T_1$ [° C.] and a Q [kj] amount of heat applied to the same, in which: (a) an inner portion fitted by means of size and shape to the external dimensions of the MRD; (b) at least one second temperature $T_2$ [° C.] in the inner portion; (c) a specific mass, m [kg]; and, (d) specific heat capacity, $C_p$ [kj/kg]; wherein the following formula is being held true: $Q=C_p$ m dT; where $dT=T_1-T_2$, wherein for each applied Q, $dT_2$ is in the range of 0° C.-0.2° C.; where $dT_2=T_2+dT$.

It is another object of the current invention to disclose the thermo isolating jacket as defined in any of the above, wherein at least a portion of the jacket comprising n layers.

It is another object of the current invention to disclose the thermo isolating jacket as defined in any of the above, wherein at least 2 of the n layers comprising a substantially different specific heat capacity $C_p$ for each layer; where each of the layers has at least one first temperature $H_1$ [° C.] measured on the outer side of the layer, and at least one first temperature $H_2$ [° C.], measured on its inner side towards the MRD, having a $dH_1- \ldots dHn$, where dT of thermo isolating jacket equals $H_1-Hn$.

It is another object of the current invention to disclose the thermo isolating jacket as defined in any of the above, wherein the jacket comprising at least one opening to permit access to the MRD.

It is another object of the current invention to disclose the thermo isolating jacket as defined in any of the above, wherein at least a portion of the thermo isolating jacket comprising a material selected from a group consisting of:

thermo insulating material, sealing material, foam material, fire retardant materials, at least partially transparent material and any combination thereof.

It is another object of the current invention to disclose the thermo isolating jacket as defined in any of the above, wherein at least a portion of the thermo isolating jacket comprises means for shielding at least a portion of the MRD from a selected from a group consisting of: magnetism, electromagnetic interference, physical damage and any combination thereof.

It is another object of the current invention to disclose the thermo isolating jacket as defined in any of the above, wherein the thermo isolating jacket comprises a conduit having at least one first aperture to the MRD bore and at least one aperture to the external environment, fitted for the passage of tubing within; further wherein the conduit is configured to attenuate the passage of frequencies selected from a group consisting of: 0 to about 1000 MHz, 0 to about 500 MHz, 0 to about 200 MHz and any combination thereof.

It is another object of the current invention to disclose the thermo isolating jacket as defined in any of the above, wherein the conduit is configured to attenuate electromagnetic interference by means selected from a group consisting of: waveguide, RF filter, waveguide filter, attenuating material, and any combination thereof.

It is another object of the current invention to disclose the thermo isolating jacket as defined in any of the above, wherein the jacket is connected to the MRD operating system.

It is another object of the current invention to disclose the thermo isolating jacket as defined in any of the above, wherein the jacket comprising modular pieces reversibly connectable to form the thermo isolating jacket.

It is another object of the current invention to disclose the thermo isolating jacket as defined in any of the above, wherein the jacket comprises at least one fastener to secure a selected from a group consisting of: a connection between the MRD and the thermo isolating jacket, structural integrity of the thermo isolating jacket, and any combination thereof.

It is another object of the current invention to disclose the thermo isolating jacket as defined in any of the above, wherein at least a portion comprising channels for passage of a substance selected from a group consisting of: gas, liquid, or any combination thereof.

It is another object of the current invention to disclose the thermo isolating jacket as defined in any of the above, wherein at least a portion comprises an active thermo regulating system.

It is another object of the current invention to disclose the thermo isolating jacket as defined in any of the above, wherein the system is configured to a setting selected from a group consisting of: maintain a predetermined temperature, operate only when a predetermined temperature has been measured within the inner volume, respond to temperature changes in the external environment, operate only within a predetermined temperature range, shut down at a predetermined temperature and any combination thereof.

It is another object of the current invention to disclose the thermo isolating jacket as defined in any of the above, wherein at least a portion of the jacket comprising a passive thermo-regulating envelope surrounding an active thermo-regulating system.

It is another object of the current invention to disclose the thermo isolating jacket as defined in any of the above, wherein the thermo isolating jacket comprises at least one sensor selected from a group consisting of: temperature sensors, EMI sensors, magnetic sensors, vibration sensors, connection sensors, and any combination thereof.

It is another object of the current invention to disclose the thermo isolating jacket as defined in any of the above, comprising temperature sensors, wherein the sensors are configured to sense the inner volume temperature, the external environment temperature or both.

It is another object of the current invention to disclose the thermo isolating jacket as defined in any of the above, wherein the thermo isolating jacket is connected to a component selected from a group consisting of: a CPU, an alarm system, at least one indicator, at least one sensor, and any combination thereof.

It is another object of the current invention to disclose the thermo isolating jacket as defined in any of the above, wherein at least a portion comprising a user interface.

The present invention provides a thermal isolating jacket for a magnetic resonance device (MRD) having an external dimensions A [m$^2$], configured to be positioned in an atmospheric pressure, temperature changing environment, having at least one first temperature $T_1$ [° C.] and at least one second temperature $T_2$ [° C.], in which: (a) an inner portion fitted by means of size and shape to the external dimensions of the MRD; (b) thermal conductivity, k [W/m ° C.]; (c) thickness, s [m]; and, (d) conductive heat transfer, q [W]; wherein the following formula is being held true: q=k A dT/s, where dT equals $T_2-T_1$ and q<<0.01 W.

It is another object of the current invention to disclose the thermo isolating jacket as defined in any of the above, wherein at least a portion of the jacket comprising n layers.

It is another object of the current invention to disclose the thermo isolating jacket as defined in any of the above, wherein at least 2 of the n layers comprising a substantially different conductive heat transfer value q for each layer; where each of the layers has at least one first temperature $H_1$ [° C.] measured on the outer side of the layer, and at least one first temperature $H_2$ [° C.], measured on its inner side towards the MRD, having a $dH_1$- ... dHn, where dT of thermo isolating jacket equals $H_1$-Hn.

It is another object of the current invention to disclose the thermo isolating jacket as defined in any of the above, wherein the jacket comprising at least one opening to permit access to the MRD.

It is another object of the current invention to disclose the thermo isolating jacket as defined in any of the above, wherein at least a portion of the thermo isolating jacket comprising a material selected from a group consisting of: thermo insulating material, sealing material, foam material, fire retardant materials, at least partially transparent material and any combination thereof.

It is another object of the current invention to disclose the thermo isolating jacket as defined in any of the above, wherein at least a portion of the thermo isolating jacket comprises means for shielding at least a portion of the MRD from a selected from a group consisting of: magnetism, electromagnetic interference, physical damage and any combination thereof.

It is another object of the current invention to disclose the thermo isolating jacket as defined in any of the above, wherein the thermo isolating jacket comprises a conduit having at least one first aperture to the MRD bore and at least one aperture to the external environment, fitted for the passage of tubing within; further wherein the conduit is configured to attenuate the passage of frequencies selected from a group consisting of: 0 to about 1000 MHz, 0 to about 500 MHz, 0 to about 200 MHz and any combination thereof.

It is another object of the current invention to disclose the thermo isolating jacket as defined in any of the above, wherein the conduit is configured to attenuate electromagnetic interference by means selected from a group consisting of: waveguide, RF filter, waveguide filter, attenuating material, and any combination thereof.

It is another object of the current invention to disclose the thermo isolating jacket as defined in any of the above, wherein the jacket is connected to the MRD operating system.

It is another object of the current invention to disclose the thermo isolating jacket as defined in any of the above, wherein the jacket comprising modular pieces reversibly connectable to form the thermo isolating jacket.

It is another object of the current invention to disclose the thermo isolating jacket as defined in any of the above, wherein the jacket comprises at least one fastener to secure a selected from a group consisting of: a connection between the MRD and the thermo isolating jacket, structural integrity of the thermo isolating jacket, and any combination thereof.

It is another object of the current invention to disclose the thermo isolating jacket as defined in any of the above, wherein at least a portion comprising channels for passage of a substance selected from a group consisting of: gas, liquid, or any combination thereof.

It is another object of the current invention to disclose the thermo isolating jacket as defined in any of the above, wherein at least a portion comprises an active thermo regulating system.

It is another object of the current invention to disclose the thermo isolating jacket as defined in any of the above, wherein the system is configured to a setting selected from a group consisting of: maintain a predetermined temperature, operate only when a predetermined temperature has been measured within the inner volume, respond to temperature changes in the external environment, operate only within a predetermined temperature range, shut down at a predetermined temperature and any combination thereof.

It is another object of the current invention to disclose the thermo isolating jacket as defined in any of the above, wherein at least a portion of the jacket comprising a passive thermo-regulating envelope surrounding an active thermo-regulating system.

It is another object of the current invention to disclose the thermo isolating jacket as defined in any of the above, wherein the thermo isolating jacket comprises at least one sensor selected from a group consisting of: temperature sensors, EMI sensors, magnetic sensors, vibration sensors, connection sensors, and any combination thereof.

It is another object of the current invention to disclose the thermo isolating jacket as defined in any of the above, comprising temperature sensors, wherein the sensors are configured to sense the inner volume temperature, the external environment temperature or both.

It is another object of the current invention to disclose the thermo isolating jacket as defined in any of the above, wherein the thermo isolating jacket is connected to a component selected from a group consisting of: a CPU, an alarm system, at least one indicator, at least one sensor, and any combination thereof.

It is another object of the current invention to disclose the thermo isolating jacket as defined in any of the above, wherein at least a portion comprising a user interface.

The present invention provides a thermal isolating jacket for a magnetic resonance device (MRD) having an external dimensions A [$m^2$], configured to be positioned in an atmospheric pressure system and a temperature changing environment having at least one first temperature $T_1$ [° C.] and at least one second temperature $T_2$ [° C.], the jacket is characterized by a thermal expansion coefficient substantially different than 0.

It is another object of the current invention to disclose the thermo isolating jacket as defined in any of the above, wherein at least a portion of the jacket comprising n layers.

It is another object of the current invention to disclose the thermo isolating jacket as defined in any of the above, wherein at least 2 of the n layers comprising a substantially different thermal expansion coefficient for each layer; where each of the layers has at least one first temperature $H_1$ [° C.] measured on the outer side of the layer, and at least one first temperature $H_2$ [° C.], measured on its inner side towards the MRD, having a $dH_1 - \ldots dH_n$, where dT of thermo isolating jacket equals $H_1 - H_n$.

It is another object of the current invention to disclose the thermo isolating jacket as defined in any of the above, for an MRD having a length $L_{0,\ MRD}$ [m], in which: (a) an inner portion fitted by means of size and shape to the external dimensions A of the MRD; (b) length $L_{0,\ Jacket}$ [m] fitted by means of size and shape to the $L_{0,MRD}$; and, (c) linear thermal expansion coefficient $\alpha_L$ [° C.$^{-1}$] substantially different than 0; (d) wherein if dT substantially different than 0; the length $L_{0,\ Jacket}$ will be varied to $L_{1,\ Jacket}$, such that the following formula is being held true for any change in temperature, dT:

$$\alpha_L = \frac{1}{L}\frac{dL}{dT}$$

where dL equals $L_{1,\ Jacket} - L_{0,Jacket}$ and dT equals $T_2 - T_1$.

It is another object of the current invention to disclose the thermo isolating jacket as defined in any of the above, in which: (a) an inner portion fitted by means of size and shape to the external dimensions A of the MRD; (b) volume $V_{0\ Jacket}$ [m]; and, (c) volumetric thermal expansion coefficient $\alpha_V$ [° C.$^{-1}$] substantially different than 0; wherein if dT substantially different than 0; the volume $V_{0,\ Jacket}$ will be varied to $V_{1,\ Jacket}$, such that the following formula is being held true for any change in temperature, dT:

$$\alpha_V = \frac{1}{V}\left(\frac{\partial V}{\partial T}\right)$$

where dV equals $V_{1,\ Jacket} - V_{0,Jacket}$ and dT equals $T_2 - T_1$.

It is another object of the current invention to disclose the thermo isolating jacket as defined in any of the above, in which: (a) an inner portion fitted by means of size and shape to the external dimensions A of the MRD; (b) area $A_{0,\ Jacket}$ [$m^2$]; and, (c) area thermal expansion coefficient $\alpha_A$ [° C.$^{-1}$] substantially different than 0; wherein if dT substantially different than 0; the length $A_{0,\ Jacket}$ will be varied to $A_{1,\ Jacket}$, such that the following formula is being held true for any change in temperature, dT:

$$\alpha_A = \frac{1}{A}\frac{dA}{dT}$$

where dA equals $A_{1,\ Jacket} - A_{0,Jacket}$ and dT equals $T_2 - T_1$.

It is another object of the current invention to disclose the thermo isolating jacket as defined in any of the above, wherein the jacket comprising at least one opening to permit access to the MRD.

It is another object of the current invention to disclose the thermo isolating jacket as defined in any of the above, wherein at least a portion of the thermo isolating jacket comprising a material selected from a group consisting of: thermo insulating material, sealing material, foam material, fire retardant materials, at least partially transparent material and any combination thereof.

It is another object of the current invention to disclose the thermo isolating jacket as defined in any of the above, wherein at least a portion of the thermo isolating jacket comprises means for shielding at least a portion of the MRD from a selected from a group consisting of: magnetism, electromagnetic interference, physical damage and any combination thereof.

It is another object of the current invention to disclose the thermo isolating jacket as defined in any of the above, wherein the thermo isolating jacket comprises a conduit having at least one first aperture to the MRD bore and at least one aperture to the external environment, fitted for the passage of tubing within; further wherein the conduit is configured to attenuate the passage of frequencies selected from a group consisting of: 0 to about 1000 MHz, 0 to about 500 MHz, 0 to about 200 MHz and any combination thereof.

It is another object of the current invention to disclose the thermo isolating jacket as defined in any of the above, wherein the conduit is configured to attenuate electromagnetic interference by means selected from a group consisting of: waveguide, RF filter, waveguide filter, attenuating material, and any combination thereof.

It is another object of the current invention to disclose the thermo isolating jacket as defined in any of the above, wherein the jacket is connected to the MRD operating system.

It is another object of the current invention to disclose the thermo isolating jacket as defined in any of the above, wherein the jacket comprising modular pieces reversibly connectable to form the thermo isolating jacket.

It is another object of the current invention to disclose the thermo isolating jacket as defined in any of the above, wherein the jacket comprises at least one fastener to secure a selected from a group consisting of: a connection between the MRD and the thermo isolating jacket, structural integrity of the thermo isolating jacket, and any combination thereof.

It is another object of the current invention to disclose the thermo isolating jacket as defined in any of the above, wherein at least a portion comprising channels for passage of a substance selected from a group consisting of: gas, liquid, or any combination thereof.

It is another object of the current invention to disclose the thermo isolating jacket as defined in any of the above, wherein at least a portion comprises an active thermo regulating system.

It is another object of the current invention to disclose the thermo isolating jacket as defined in any of the above, wherein the system is configured to a setting selected from a group consisting of: maintain a predetermined temperature, operate only when a predetermined temperature has been measured within the inner volume, respond to temperature changes in the external environment, operate only within a predetermined temperature range, shut down at a predetermined temperature and any combination thereof.

It is another object of the current invention to disclose the thermo isolating jacket as defined in any of the above, wherein at least a portion of the jacket comprising a passive thermo-regulating envelope surrounding an active thermo-regulating system.

It is another object of the current invention to disclose the thermo isolating jacket as defined in any of the above, wherein the thermo isolating jacket comprises at least one sensor selected from a group consisting of: temperature sensors, EMI sensors, magnetic sensors, vibration sensors, connection sensors, and any combination thereof.

It is another object of the current invention to disclose the thermo isolating jacket as defined in any of the above, comprising temperature sensors, wherein the sensors are configured to sense the inner volume temperature, the external environment temperature or both.

It is another object of the current invention to disclose the thermo isolating jacket as defined in any of the above, wherein the thermo isolating jacket is connected to a component selected from a group consisting of: a CPU, an alarm system, at least one indicator, at least one sensor, and any combination thereof.

It is another object of the current invention to disclose the thermo isolating jacket as defined in any of the above, wherein at least a portion comprising a user interface.

The present invention provides a method for thermo-regulating an magnetic resonance device (MRD), configured to be positioned in an atmospheric pressure system and temperature changing environment, having at least one first temperature $T_1$ [° C.] and a Q [kj] amount of heat applied to the same, comprising steps of: (a) obtaining a thermal isolating jacket for an MRD, in which (i) an inner portion fitted by means of size and shape to the external dimensions of the MRD; (ii) at least one second temperature $T_2$ [° C.] in the inner portion; (iii) a specific mass, m [kg]; and (iv) specific heat capacity, $C_p$ [kj/kg]; and, (b) operating the same; wherein the step of obtaining the thermal isolating jacket such that the following formula is held true: $Q=C_p$ m dT; where $dT=T_1-T_2$, wherein for each applied Q, dT2 is in the range of 0° C.-0.2° C.; where $dT_2=T_2+dT$.

It is another object of the current invention to disclose the method as defined in any of the above, additionally comprising a step of selecting the thermo regulating jacket in which at least a portion is constructed of n layers.

It is another object of the current invention to disclose the method as defined in any of the above, additionally comprising a step of selecting at least 2 of the n layers comprising a substantially different specific heat capacity $C_p$ for each layer; where each of the layers has at least one first temperature $H_1$ [° C.] measured on the outer side of the layer, and at least one first temperature $H_2$ [° C.], measured on its inner side towards the MRD, having a $dH_1-\ldots dHn$, where dT of thermo isolating jacket equals $H_1-Hn$.

It is another object of the current invention to disclose the method as defined in any of the above, additionally comprising a step of selecting the thermo isolating jacket having at least one opening to permit access to the MRD.

It is another object of the current invention to disclose the method as defined in any of the above, additionally comprising a step of selecting the thermo isolating jacket in which at least a portion is made with a material selected from a group consisting of: thermo insulating material, sealing material, foam material, fire retardant materials, at least partially transparent material and any combination thereof.

It is another object of the current invention to disclose the method as defined in any of the above, additionally comprising a step of selecting the thermo isolating jacket in which at least a portion of the thermo isolating jacket comprising means for shielding at least a portion of the MRD from a selected from a group consisting of: magnetism, electromagnetic interference, physical damage and any combination thereof.

It is another object of the current invention to disclose the method as defined in any of the above, additionally comprising a step of the selecting the thermo isolating jacket comprising a conduit having at least one first aperture to the MRD bore and at least one aperture to the external environment, fitted for the passage of tubing within; further wherein the conduit is configured to attenuate the passage of frequencies selected from a group consisting of: 0 to about 1000 MHz, 0 to about 500 MHz, 0 to about 200 MHz and any combination thereof.

It is another object of the current invention to disclose the method as defined in any of the above, additionally comprising a step of the conduit attenuating electromagnetic interference by means selected from a group consisting of: waveguide, RF filter, waveguide filter, attenuating material, and any combination thereof.

It is another object of the current invention to disclose the method as defined in any of the above, additionally comprising a step of connecting the jacket to an operating system of the MRD.

It is another object of the current invention to disclose the method as defined in any of the above, additionally comprising a step of assembling the jacket from modular pieces reversibly connecting to form the thermo isolating jacket.

It is another object of the current invention to disclose the method as defined in any of the above, additionally comprising a step of securing the a selected from a group consisting of: a connection between the MRD and the thermo isolating jacket, structural integrity of the thermo isolating jacket, and any combination thereof, with at least one fastener.

It is another object of the current invention to disclose the method as defined in any of the above, additionally comprising a step of selecting the thermo isolating jacket in which at least a portion harbors channels for passing of a substance selected from a group consisting of: gas, liquid, or any combination thereof.

It is another object of the current invention to disclose the method as defined in any of the above, additionally comprising a step of selecting the thermo isolating jacket in which at least a portion has an active thermo regulating system.

It is another object of the current invention to disclose the method as defined in any of the above, additionally comprising a step of operating an active thermo regulating system, thereby heating or cooling the MRD.

It is another object of the current invention to disclose the method as defined in any of the above, additionally comprising a step of configuring the to a setting selected from a group consisting of: maintain a predetermined temperature, operate only when a predetermined temperature has been measured within the inner volume, respond to temperature changes in the external environment, operate only within a predetermined temperature range, shut down at a predetermined temperature and any combination thereof.

It is another object of the current invention to disclose the method as defined in any of the above, additionally comprising a step of selecting the thermo isolating jacket in which at least a portion of the jacket having a passive thermo-regulating envelope surrounding an active thermo-regulating system.

It is another object of the current invention to disclose the method as defined in any of the above, additionally comprising a step of selecting the thermo isolating jacket having at least one sensor selected from a group consisting of: temperature sensors, EMI sensors, magnetic sensors, vibration sensors, connection sensors, and any combination thereof.

It is another object of the current invention to disclose the method as defined in any of the above, additionally comprising a step of configuring the sensors to sense the inner volume temperature, the external environment temperature or both.

It is another object of the current invention to disclose the method as defined in any of the above, additionally comprising a step of connecting the thermo isolating jacket to a component selected from a group consisting of: a CPU, an alarm system, at least one indicator, at least one sensor, and any combination thereof.

It is another object of the current invention to disclose the method as defined in any of the above, additionally comprising a step of connecting at least a portion of the thermo isolating jacket to a user interface.

The present invention provides a method for thermo regulating a magnetic resonance device (MRD), having an external dimensions A $[m^2]$, configured to be positioned in an atmospheric pressure, temperature changing environment, having at least one first temperature $T_1$ [° C.] and at least one second temperature $T_2$ [° C.], comprising steps of: (a) obtaining a thermal isolating jacket for the MRD in which (i) an inner portion fitted by means of size and shape to the external dimensions A $[m^2]$ of the MRD; (ii) thermal conductivity, k [W/m ° C.]; (iii) thickness, s [m]; and, (iv) conductive heat transfer, q [W]; and, (b) operating the same; wherein the step of obtaining the thermo isolating jacket such that the following formula is held true: q=k A dT/s, where dT equals $T_2-T_1$ and q<<0.01 W.

It is another object of the current invention to disclose the method as defined in any of the above, additionally comprising a step of selecting the thermo regulating jacket in which at least a portion is constructed of n layers.

It is another object of the current invention to disclose the method as defined in any of the above, additionally comprising a step of selecting at least 2 of the n layers having a substantially different conductive heat transfer value q for each layer; where each of the layers has at least one first temperature $H_1$ [° C.] measured on the outer side of the layer, and at least one first temperature $H_2$ [° C.], measured on its inner side towards the MRD, having a $dH_1$ - . . . dHn, where dT of thermo isolating jacket equals $H_1-Hn$.

It is another object of the current invention to disclose the method as defined in any of the above, additionally comprising a step of selecting the thermo isolating jacket having at least one opening to permit access to the MRD.

It is another object of the current invention to disclose the method as defined in any of the above, additionally comprising a step of selecting the thermo isolating jacket in which at least a portion is made with a material selected from a group consisting of: thermo insulating material, sealing material, foam material, fire retardant materials, at least partially transparent material and any combination thereof.

It is another object of the current invention to disclose the method as defined in any of the above, additionally comprising a step of selecting the thermo isolating jacket in which at least a portion of the thermo isolating jacket comprises means for shielding at least a portion of the MRD from a selected from a group consisting of: magnetism, electromagnetic interference, physical damage and any combination thereof.

It is another object of the current invention to disclose the method as defined in any of the above, additionally comprising a step of the selecting the thermo isolating jacket comprising a conduit having at least one first aperture to the MRD bore and at least one aperture to the external environment, fitted for the passage of tubing within; further wherein the conduit is configured to attenuate the passage of frequencies selected from a group consisting of: 0 to about 1000 MHz, 0 to about 500 MHz, 0 to about 200 MHz and any combination thereof.

It is another object of the current invention to disclose the method as defined in any of the above, additionally comprising a step of the conduit attenuating electromagnetic interference by means selected from a group consisting of: waveguide, RF filter, waveguide filter, attenuating material, and any combination thereof.

It is another object of the current invention to disclose the method as defined in any of the above, additionally comprising a step of connecting the jacket to an operating system of the MRD.

It is another object of the current invention to disclose the method as defined in any of the above, additionally comprising a step of assembling the jacket from modular pieces reversibly connecting to form the thermo isolating jacket.

It is another object of the current invention to disclose the method as defined in any of the above, additionally comprising a step of securing the a selected from a group consisting of: a connection between the MRD and the thermo isolating jacket, structural integrity of the thermo isolating jacket, and any combination thereof, with at least one fastener.

It is another object of the current invention to disclose the method as defined in any of the above, additionally comprising a step of selecting the thermo isolating jacket in which at least a portion harbors channels for passing of a substance selected from a group consisting of: gas, liquid, or any combination thereof.

It is another object of the current invention to disclose the method as defined in any of the above, additionally comprising a step of selecting the thermo isolating jacket in which at least a portion has an active thermo regulating system.

It is another object of the current invention to disclose the method as defined in any of the above, additionally comprising a step of operating an active thermo regulating system, thereby heating or cooling the MRD.

It is another object of the current invention to disclose the method as defined in any of the above, additionally comprising a step of configuring the to a setting selected from a group consisting of: maintain a predetermined temperature, operate only when a predetermined temperature has been measured within the inner volume, respond to temperature changes in the external environment, operate only within a predetermined temperature range, shut down at a predetermined temperature and any combination thereof.

It is another object of the current invention to disclose the method as defined in any of the above, additionally comprising a step of selecting the thermo isolating jacket in which at least a portion of the jacket having a passive thermo-regulating envelope surrounding an active thermo-regulating system.

It is another object of the current invention to disclose the method as defined in any of the above, additionally comprising a step of selecting the thermo isolating jacket having at least one sensor selected from a group consisting of: temperature sensors, EMI sensors, magnetic sensors, vibration sensors, connection sensors, and any combination thereof.

It is another object of the current invention to disclose the method as defined in any of the above, additionally comprising a step of configuring the sensors to sense the inner volume temperature, the external environment temperature or both.

It is another object of the current invention to disclose the method as defined in any of the above, additionally comprising a step of connecting the thermo isolating jacket to a component selected from a group consisting of: a CPU, an alarm system, at least one indicator, at least one sensor, and any combination thereof.

It is another object of the current invention to disclose the method as defined in any of the above, additionally comprising a step of connecting at least a portion of the thermo isolating jacket to a user interface.

The present invention provides a method for thermo regulating a magnetic resonance device (MRD) having an external dimensions A [m$^2$], configured to be positioned in an atmospheric pressure, temperature changing environment, having at least one first temperature $T_1$ [° C.] and at least one second temperature $T_2$ [° C.], comprising steps of: (a) obtaining a thermal isolating jacket for the MRD; and, (b) operating the same, wherein the step of obtaining the thermo isolating jacket such that the thermo isolating jacket is of a thermal expansion coefficient substantially different than 0.

It is another object of the current invention to disclose the method as defined in any of the above, additionally comprising a step of selecting the thermo regulating jacket in which at least a portion is constructed of n layers It is another object of the current invention to disclose the method as defined in any of the above, additionally comprising a step of selecting at least 2 of the n layers comprising a substantially different thermal expansion coefficient for each layer; where each of the layers has at least one first temperature $H_1$ [° C.] measured on the outer side of the layer, and at least one first temperature $H_2$ [° C.], measured on its inner side towards the MRD, having a $dH_1$- ... $dHn$, where dT of thermo isolating jacket equals $H_1$-$Hn$.

It is another object of the current invention to disclose the method as defined in any of the above, additionally comprising a step of selecting the thermo isolating jacket for the MRD having a length $L_{0,\ MRD}$ [m], in which: (a) an inner portion fitted by means of size and shape to the external dimensions A of the MRD; (b) length $L_{0,\ Jacket}$ [m] fitted by means of size and shape to the $L_{0,MRD}$; and (c) linear thermal expansion coefficient $\alpha_L$ [° C.$^{-1}$] substantially different than 0; such that if dT substantially different than 0; the length $L_{0,\ Jacket}$ will be varied to $L_{1,\ Jacket}$ such that the following formula is being held true for any change in temperature, dT:

$$\alpha_L = \frac{1}{L}\frac{dL}{dT}$$

where dL equals $L_{1,\ Jacket}$-$L_{0,Jacket}$ and dT equals $T_2$-$T_1$.

It is another object of the current invention to disclose the method as defined in any of the above, additionally comprising a step of selecting the thermo isolating jacket, in which: (a) an inner portion fitted by means of size and shape to the external dimensions A of the MRD; (b) volume $V_{0\ Jacket}$ [m]; and, (c) volumetric thermal expansion coefficient $\alpha_V$ [° C.$^{-1}$] substantially different than 0; such that if dT substantially different than 0; the volume $V_{0,\,Jacket}$ will be varied to $V_{1,\,Jacket}$, such that the following formula is being held true for any change in temperature, dT:

$$\alpha_V = \frac{1}{V}\left(\frac{\partial V}{\partial T}\right)$$

where dV equals $V_{1,\,Jacket}-V_{0,Jacket}$ and dT equals $T_2-T_1$.

It is another object of the current invention to disclose the method as defined in any of the above, additionally comprising a step of selecting the thermo isolating jacket, in which: (a) an inner portion fitted by means of size and shape to the external dimensions A of the MRD; (b) area $A_{0,\,Jacket}$ [m$^2$]; and, (c) area thermal expansion coefficient $\alpha_A$ [° C.$^{-1}$] substantially different than 0; such that if dT substantially different than 0; the length $A_{0,\,Jacket}$ will be varied to $A_{1,\,Jacket}$, such that the following formula is being held true for any change in temperature, dT:

$$\alpha_A = \frac{1}{A}\frac{dA}{dT}$$

where dA equals $A_{1,\,Jacket}-A_{0,Jacket}$ and dT equals $T_2-T_1$.

It is another object of the current invention to disclose the method as defined in any of the above, additionally comprising a step of selecting the thermo isolating jacket having at least one opening to permit access to the MRD.

It is another object of the current invention to disclose the method as defined in any of the above, additionally comprising a step of selecting the thermo isolating jacket in which at least a portion is made with a material selected from a group consisting of: thermo insulating material, sealing material, foam material, fire retardant materials, at least partially transparent material and any combination thereof.

It is another object of the current invention to disclose the method as defined in any of the above, additionally comprising a step of selecting the thermo isolating jacket in which at least a portion of the thermo isolating jacket comprising means for shielding at least a portion of the MRD from a selected from a group consisting of: magnetism, electromagnetic interference, physical damage and any combination thereof.

It is another object of the current invention to disclose the method as defined in any of the above, additionally comprising a step of the selecting the thermo isolating jacket comprises a conduit having at least one first aperture to the MRD bore and at least one aperture to the external environment, fitted for the passage of tubing within; further wherein the conduit is configured to attenuate the passage of frequencies selected from a group consisting of: 0 to about 1000 MHz, 0 to about 500 MHz, 0 to about 200 MHz and any combination thereof.

It is another object of the current invention to disclose the method as defined in any of the above, additionally comprising a step of the conduit attenuating electromagnetic interference by means selected from a group consisting of: waveguide, RF filter, waveguide filter, attenuating material, and any combination thereof.

It is another object of the current invention to disclose the method as defined in any of the above, additionally comprising a step of connecting the jacket to an operating system of the MRD.

It is another object of the current invention to disclose the method as defined in any of the above, additionally comprising a step of assembling the jacket from modular pieces reversibly connecting to form the thermo isolating jacket.

It is another object of the current invention to disclose the method as defined in any of the above, additionally comprising a step of securing the a selected from a group consisting of: a connection between the MRD and the thermo isolating jacket, structural integrity of the thermo isolating jacket, and any combination thereof, with at least one fastener.

It is another object of the current invention to disclose the method as defined in any of the above, additionally comprising a step of selecting the thermo isolating jacket in which at least a portion harbors channels for passing of a substance selected from a group consisting of: gas, liquid, or any combination thereof.

It is another object of the current invention to disclose the method as defined in any of the above, additionally comprising a step of selecting the thermo isolating jacket in which at least a portion has an active thermo regulating system.

It is another object of the current invention to disclose the method as defined in any of the above, additionally comprising a step of operating an active thermo regulating system, thereby heating or cooling the MRD.

It is another object of the current invention to disclose the method as defined in any of the above, additionally comprising a step of configuring the to a setting selected from a group consisting of: maintain a predetermined temperature, operate only when a predetermined temperature has been measured within the inner volume, respond to temperature changes in the external environment, operate only within a predetermined temperature range, shut down at a predetermined temperature and any combination thereof.

It is another object of the current invention to disclose the method as defined in any of the above, additionally comprising a step of selecting the thermo isolating jacket in which at least a portion of the jacket having a passive thermo-regulating envelope surrounding an active thermo-regulating system.

It is another object of the current invention to disclose the method as defined in any of the above, additionally comprising a step of selecting the thermo isolating jacket having at least one sensor selected from a group consisting of: temperature sensors, EMI sensors, magnetic sensors, vibration sensors, connection sensors, and any combination thereof.

It is another object of the current invention to disclose the method as defined in any of the above, additionally comprising a step of configuring the sensors to sense the inner volume temperature, the external environment temperature or both.

It is another object of the current invention to disclose the method as defined in any of the above, additionally comprising a step of connecting the thermo isolating jacket to a component selected from a group consisting of: a CPU, an alarm system, at least one indicator, at least one sensor, and any combination thereof.

It is another object of the current invention to disclose the method as defined in any of the above, additionally comprising a step of connecting at least a portion of the thermo isolating jacket to a user interface.

BRIEF DESCRIPTION OF THE FIGURES

In the following detailed description of the preferred embodiments, reference is made to the accompanying drawings that form a part hereof, and in which are shown by way of illustration specific embodiments in which the invention may be practiced. It is understood that other embodiments may be utilized and structural changes may be made without departing from the scope of the present invention. The present invention may be practiced according to the claims without some or all of these specific details. For the purpose of clarity, technical material that is known in the technical fields related to the invention has not been described in detail so that the present invention is not unnecessarily obscured. In the accompanying drawing:

FIG. 11A is a schematic illustration of an embodiment of top perforated parts of the MRD thermo isolating jacket;

FIG. 11B is a schematic illustration of an embodiment of side perforated parts of the MRD thermo isolating jacket;

FIG. 12 is a schematic illustration of an embodiment of corrugated parts of the MRD thermo isolating jacket;

DETAILED DESCRIPTION OF THE PREFERRED EMBODIMENTS

Figure 1A:
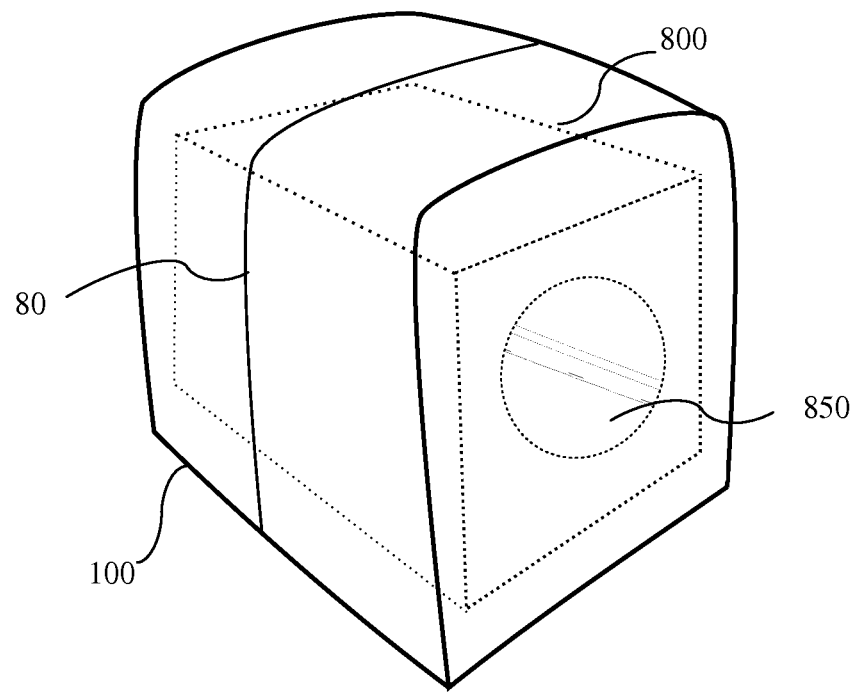
FIG. 1A is a schematic illustration of an MRD thermo isolating jacket.

In the following detailed description of the preferred embodiments, reference is made to the accompanying drawings that form a part hereof, and in which are shown by way of illustration specific embodiments in which the invention may be practiced. It is understood that other embodiments may be utilized and structural changes may be made without departing from the scope of the present invention. The present invention may be practiced according to the claims without some or all of these specific details. For the purpose of clarity, technical material that is known in the technical fields related to the invention has not been described in detail so that the present invention is not unnecessarily obscured.

The essence of the present invention is to provide a passive thermo isolating jacket fitted to accommodate an MRD that allows thermal insulation of the MRD from the external environment. The present invention further provides passive thermo isolation in combination with active temperature regulation of an MRD, thereby stabling conditions for the operation of the MRD. The temperature regulating jacket of the present invention will enable quality imaging consistent with changing environmental conditions, thereby increasing the efficiency of MRD examinations.

The term 'magnetic resonance imaging device' (MRD), specifically applies hereinafter to any Magnetic Resonance Imaging (MRI) device, any Nuclear Magnetic Resonance (NMR) spectroscope, any Electron Spin Resonance (ESR) spectroscope, any Nuclear Quadruple Resonance (NQR) or any combination thereof. The term, in this invention, also applies to any other analyzing and imaging instruments comprising a volume of interest, such as computerized tomography (CT), ultrasound (US) etc. The MRD hereby disclosed is optionally a portable MRI device, such as the ASPECT-MR Ltd commercially available devices, or a commercially available non-portable device.

The term "external environment" refers hereinafter to the external space outside of the MRD.

The term "about" refers hereinafter to 20% more or less than the defied value.

The term "signal-to-noise ratio" refers hereinafter to a measure used to compare the level of a desired signal to the level of background noise. A ratio greater than 1:1 indicates more signal than noise. In imaging, the signal to noise ratio indicates the sensitivity of the imaging, resulting in image quality.

The term "patient" interchangeably refers herein after to a term selected from a group of: neonate, baby, infant, toddler, child, adolescent, adult, elderly, etc.; further this term refers to a whole patient or a portion thereof; further this term refers to person, animal or sample.

The term "connected" in reference to the MRD, thermo isolating jacket, parts and modules, interchangeably refers hereinafter to any contact, relation, association, integration, interconnection, joining, inserting, sewing, welding, interweaving, placing, nesting, layering, akin, linkage, unity, alliance, bracketed, combination, coupling, banding, bonding, affiliation, fitting, pairing, attachment, hooking, hinging, welding, adhering, fusion, fixing, tying, sewing, embedding, weaving, etc., of the thermo isolating jacket parts to each other and to a third party. When in an embodiment the thermo isolating jacket comprises at least two connected parts, the parts can be separated one from the other in a manner selected from a group consisting of: sliding, uncovering, dividing, rupturing, cleaving, disjoining, splitting, bending, screwing, swinging, opening, separating, dismounting, embedding, interweaving, uncoupling, implanting, detaching, breaking, hatching, pulling, peeling, untying, pushing, turning, levering, releasing, unlinking, pressing, moving, snapping, unscrewing, fitting, placing, adhering, disconnecting and any combination thereof; and contrariwise connected to each other in a manner selected from a group consisting of: sliding, covering, joining, bending, screwing, swinging, pairing, mounting, embedding, interweaving, coupling, implanting, attaching, pulling, tying, pushing, turning, levering, linking, pressing, moving, snapping, fitting, placing, adhering, connecting, interconnecting, bonding and any combination thereof.

The term "covering" interchangeably refers hereinafter to fully or partly sealing, connecting, engulfing, surrounding, sheltering, roofing, isolating, insulating, constructing, veiling, shielding, housing, sun-shading, cloaking, enveloping, encapsulating, tracing, layering, placing, wrapping, shelling, casing, screening, boxing, masking, dressing, embracing, tenting, canopy placing, umbrella placing, embedding an additional material to the object/inner volume envelope, concealing, defending, protecting, segregating from, separating from, etc., a defined volume.

The term "transparent material" interchangeably refers hereinafter to materials such as, poly-methyl methacrylate, thermoplastic polyurethane, polyethylene, polyethylene terephthalate, isophthalic acid modified polyethylene terephthalate, glycol modified polyethylene terephthalate, polypropylene, polystyrene, acrylic, polyacetate, cellulose acetate, polycarbonate, nylon, glass, polyvinyl chloride, etc. Further in some embodiments at least a portion of this material is imbedded with non transparent materials for means of strength and/or conductivity such as metallic wires.

The term "foam" interchangeably refers hereinafter to materials such as Styrofoam® commercially available from The Dow Chemical Company, polystyrene foam, high-impact polystyrene, polybutadiene, polyurethane foam, polyvinyl chloride foam, polyimide foam, silicone foam, polymethacrylimide foam, polypropylene foam, polyethylene foam, syntactic foam, rubber, polybutadiene rubber, carbon, cellulose, starch, graphite, acrylonitrile, maleic anhydride, divinylbenzene, polyisocyanurate, cementitious foam, ceramics, glass, silica, etc. Further this foam is open cell, closed cell foam, aerogels (biofoam) and can contain micro-balloons of an additional material such as glass, carbon, epoxy, etc.

The term "rubber" interchangeably refers hereinafter to materials such as natural rubber, isoprene rubber, polyisoprene, latex, butadiene rubber, styrene butadiene, nitrile rubber, butyl rubber, ethylene propylene rubber, chloroprene rubber, hypalon rubber, fluroelastomer rubber, polyacrylic rubber, urethane rubber, silicon rubber, epichlorohydrin rubber, etc.

The term "thermo insulating material" interchangeably refers hereinafter to any materials that are able to thermo-isolate an object or an inner volume from the environment. Thermo insulating materials usually have low heat conductivity values, and/or high heat capacity. The form of this material is selected from a group consisting of: solid, liquid e.g. deionized water, supplemented or not with antifreeze, foam, sheets, granulate, sand, cloth, weave, rope, knit, fiber, particles, cast, spray, aerogel, rods, plates, membrane, bricks, rubber, foil or any combination thereof. Further, the form of this material is such as: a type of foam as defined above, a type of rubber as defined above, ceramic fiber, ceramics, aluminium-magnesium silicate, yarn, knitted ropes, fiber glass, mineral wool, perlite, cellulose, rock wool, basalt, slag wool, cardboard, paper, aerogel products such as Pyrogel® XT, available commercially from Therma XX Jackets, LLC., silica aerogel, aerographene, carbon aerogels, resorcinol formaldehyde aerogel, alumina aerogels, nickel alumina aerogel, SEAgel (Safe Emulsion Agar gel), chalcogel, calcium silicate, phenolic compounds, thinsulate, urea-formaldehyde, icynene, concrete, wood, natural fibers such as hemp, sheep's wool, cotton, straw, cotton batts, cork, brick, asbestos.

The term "sealing material" interchangeably refers hereinafter to materials able to fasten or close tightly by an object or a defined volume thereby not permitting the passage of liquid, solid, or gas from the external environment to the defined volume and contrariwise. This is achieved by covering (as defined above) by elements such as wrap, cloth, fiber, sheet, plate, tent, weave, spray, paint, paste, brick, etc. Further, this element is of a material such water proof, water resistant, vacuum resistant, gas tight, drift resistant, etc.

The term "fire retardant materials" interchangeably refers hereinafter to materials such as tetrabromobisphenol-a, decabromdiphenyl ether, hexabromcyclododecane, chloroparaffins, dedecachloro-pentacyclooctadecadiene, diphenyl phosphate, triaryl phosphates, metal phosphinates, 9,10-dihydro-9-oxa-10-phosphaphenanthrene-10-oxide, trischloropropyl phosphate, ammonium polyphosphate, red phosphorous, melamine, melamine cyanurate, melamine polyphosphate, melamine polyzinc, melamine polyaluminum, phosphates, melamine-based HALS (Hindered Amine Light Stabilizer), intumescent flame retardant systems, metal hydroxides, zinc compounds antimony trioxide, expandable graphite, organo-layered silicates, natural oil polyols etc.

The term "passive thermo-regulating" interchangeably refers hereinafter to any mean that reduces the delta of temperature change of an inner volume or object in reference to the temperature of the external environment, being the object of action rather than causing action (opposed to active). This is achieved by means such as partly or fully covering, with an object or material such as thermo-insulating material as defined above, materials with thermal mass properties, utilizing thermal expansion properties, sealing material etc.

The term "Thermal mass" interchangeably refers hereinafter to a quality of an object that describes how the mass of the object provides "inertia" against temperature fluctuations. For example, when outside temperatures are fluctuating throughout the day, a large thermal mass within the insulated portion of a house can serve to "flatten out" the daily temperature fluctuations, since the thermal mass will absorb thermal energy when the surroundings are higher in temperature than the mass, and give thermal energy back when the surroundings are cooler, without reaching thermal equilibrium. As depicted in Wikipedia, scientifically, thermal mass is equivalent to thermal capacitance or heat capacity, the ability of a body to store thermal energy. It is typically referred to by the symbol $C_{th}$ and measured in units of J/° C. or J/K (which are equivalent). Thermal mass may also be used for bodies of water, machines or machine parts, living things, or any other structure or body in engineering or biology. In those contexts, the term "heat capacity" is typically used instead.

The equation relating thermal energy to thermal mass is:

$$Q = C_{th} \Delta T$$

where Q is the thermal energy transferred, $C_{th}$ is the thermal mass of the body, and $\Delta T$ is the change in temperature For a body of uniform composition, $C_{th}$ can be approximated by $$C_{th} = m c_p$$

where m is the mass of the body and $c_p$ is the isobaric specific heat capacity of the material averaged over temperature range in question.

The term "Thermal expansion" interchangeably refers hereinafter to a tendency of matter to change in length/area/volume in response to a change in temperature. When a substance is heated, its particles begin moving more and thus usually maintain a greater average separation. Materials which contract with increasing temperature are unusual; this effect is limited in size, and only occurs within limited temperature ranges. The degree of expansion divided by the change in temperature is called the material's coefficient of thermal expansion and generally varies with temperature.

The coefficient of thermal expansion describes how the size of an object changes with a change in temperature. Specifically, it measures the fractional change in size per degree change in temperature at a constant pressure. Several types of coefficients have been developed: volumetric, area, and linear. In the general case of a gas, liquid, or solid, the volumetric coefficient of thermal expansion is given by $$\alpha_V = \frac{1}{V}\left(\frac{\partial V}{\partial T}\right)_p$$

The subscript p indicates that the pressure is held constant during the expansion (atmospheric pressure). For a solid, we can ignore the effects of pressure on the material, and the volumetric thermal expansion coefficient can be written:

$$\alpha_V = \frac{1}{V}\frac{dV}{dT}$$

where V is the volume of the material, and dV/dT is the rate of change of that volume with temperature.

If we already know the expansion coefficient, then we can calculate the change in volume $$\frac{\Delta V}{V} = \alpha_V \Delta T$$

Other forms of thermal expansion in solids could be a linear or an area expansion.

Linear expansion is described as change in length measurements of an object ("linear dimension" as opposed to, e.g., volumetric dimension) due to thermal expansion is related to temperature change by a "linear expansion coefficient". It is the fractional change in length per degree of temperature change. Assuming negligible effect of pressure, we may write:

$$\alpha_L = \frac{1}{L}\frac{dL}{dT}$$

where L is a particular length measurement and dL/dT is the rate of change of that linear dimension per unit change in temperature.

The change in the linear dimension can be estimated to be:

$$\frac{\Delta L}{L} = \alpha_L \Delta T$$

The area thermal expansion coefficient relates the change in a material's area dimensions to a change in temperature. It is the fractional change in area per degree of temperature change. Ignoring pressure, we may write:

$$\alpha_A = \frac{1}{A}\frac{dA}{dT}$$

where A is some area of interest on the object, and dA/dT is the rate of change of that area per unit change in temperature.

The change in the linear dimension can be estimated as:

$$\frac{\Delta A}{A} = \alpha_A \Delta T$$

For exactly isotropic materials, and for small expansions, the volumetric thermal expansion coefficient is three times the linear coefficient:

$$\alpha_V = 3\alpha_L$$

The term "specific heat capacity" interchangeably refers hereinafter to a measurable physical quantity of heat energy required to change a unit mass of a substance by one degree in temperature. The heat supplied to a unit mass can be expressed as:

$$dQ = mcdt$$

Where dQ=heat supplied (kJ, Btu); m=unit mass (kg, lb); c=specific heat capacity (kJ/kg ° C., kJ/kg ° K, Btu/lb ° F.); dt=temperature change (K, ° C., ° F.); Expressing Specific Heat using: c=dQ/m dt.

The term "active thermo-regulating system" interchangeably refers hereinafter to a system that controls the temperature either by heating or by cooling or both, providing climate control. More specifically, the term relates to an air conditioned system, venting system, liquid (e.g. water) cooling system, a refrigerator system such as compressor refrigerator, absorption refrigerators, solar refrigerators, magnetic refrigerators, acoustic refrigerators, a vapor compression cycle mechanism), infrared heater, a water/oil-heated radiator, a coiled heater, an open coil air heater, a round open coil air heater, a convection heater, straight or formed tubular heaters, a quartz tube air heater, a capacitor-type heater, a Pelletier module, etc.

The term "venting module" interchangeably refers hereinafter to a module that circulates air and distributes it either evenly or in a defined direction. More specifically the term relates to a fan, a jet, a blower, a compressor, a pump, etc.

The term "electromagnetic interference" interchangeably refers hereinafter to electromagnetic interference (EMI), and radio-frequency interference (RFI), derived from electromagnetic radiation, electromagnetic induction, magnetism, electrostatic fields etc., that affect any electrical circuit, or imaging device such as MRD, NMR, ESR, NQR, CT, US, etc. This interference is derived from any source natural or artificial such as earth magnetic field, atmospheric noise, moving masses of metal, electrical lines, subways, cellular communication equipment, electrical devices, TV and radio stations, elevators, etc. This interference can interrupt, obstruct, degrade, limit, result in false data, etc., the effective performance of the circuit or device.

The term "electromagnetic shielding" refers hereinafter to a practice, device, or material aimed at reducing the electromagnetic field in a space by blocking the field with barriers made of conductive or magnetic materials. A device or object aimed at attenuating, blocking, reducing, shielding from or transforming the passage of EMI is referred to herein as an "EMI shield". The shielding reduces the affect of electromagnetic interference (EMI) such as radio waves, electromagnetic fields and electrostatic fields. Shielding is typically applied to isolate devices from the external environment and to cables in order to isolate wires from the environment through which the cable runs. Means for EMI shielding can operate by reflection, absorption, or by carrying the electromagnetic radiation to ground. The fundamental aim is to establish a Faraday cage to provide an EMI shield. This shielding is achieved by means such as a metallic coating of an object to be shielded, forming a Faraday cage. This coating could be perforated as long as the depth and diameter of the perforations are designed as not to allow the passage of EMI. Adequate grounding is also provided, to improve shielding. This is achieved by materials such as metals, materials integrated with metals, such as foam integrated with metals, etc. The main methods of establishing a Faraday cage and EMI shielding are metallic casing, impregnation of a polymer (conductive compounds), conductive coating (metal painting, metal plating, electro-less plating, vacuum metallizing). Using conductive plastics is another mean of achieving EM shielding. They work by including either conductive metals or conductive metallized fibers into the bulk of the material. The fibers have a high aspect ratio (length to thickness) and form a continuous conducting network inside the bulk plastic to provide the EMI shielding. These fibers are added in conjunction with a thermoplastic matrix and the overall compound can also include flame retardants or other additives. When having perforations configured to attenuate the EMI, the ratio between the length (l) and the width (w) of the perforations or opening is greater than a predefined value n, further the numerical value of n is selected from a group consisting of: $2.5<n<6$, $4<n<6$, $4<n<9$ and any combination thereof. Other means of EMI shielding are by using waveguides, RF filters, waveguide filter, capacitors, attenuating material, attenuating architecture of the shield like for example leading the EMI to a location from which it cannot pass, an RF screen, active RF shielding means and etc. any conductive material can be used for such as any metallo-containing material, conductive rubber, conductive felt, conductive plastic, conductive foam, metal, composite containing metal or conductive compound materials. Also usable are metallic (with copper e.g.) coating or plating, wire mess, or screens of conductive material.

The term "magnetic shielding" refers hereinafter to a practice or device aimed at reducing the magnetic field in a space. This is usually achieved by applying high permeability and low coercivity metal alloys that draw the magnetic shield and contain it such as nickel containing alloys.

The term "RF shielding" refers hereinafter to electromagnetic shielding that blocks radio frequency electromagnetic radiation.

The term "waveguide" interchangeably refers hereinafter to a structure that guides waves, such as electromagnetic waves or sound waves. The geometry of a waveguide reflects its function. Wave guides are constructed in different forms such as a hollow shape, solid rod, wire, etc. They are typically constructed from either conductive or dielectric materials. The frequency of the transmitted wave also dictates the shape of a waveguide. As depicted in Wikipedia, electromagnetic wave propagation along the axis of the waveguide is described by the wave equation, which is derived from Maxwell's equations, and where the wavelength depends upon the structure of the waveguide, and the material within it (air, plastic, vacuum, etc.), as well as on the frequency of the wave.

The term "waveguide cutoff" interchangeably refers hereinafter to a boundary in a system's frequency response at which energy flowing through the system begins to be reduced, attenuated or reflected rather than passing through. This property is a derivate of the size and shape of the waveguide. Therefore waveguides are designed to attenuate a specific range of frequencies having a defined amplitude, and wave length that are not able physically to propagate within a specific geometry.

The term "cutoff frequency", (fc) interchangeably refers hereinafter to the frequency beyond which the waveguide no longer effectively contains EMI. Thus, any exciting frequency lower than the cutoff frequency will be attenuated, rather than propagated through the waveguide.

The term "RF filter" interchangeably refers hereinafter to components designed to filter signals in the MHz to GHz frequency ranges. This frequency range is the range used by most broadcast radio, television, wireless communication. These components exert some kind of filtering on the signals transmitted or received. The filters could be active or passive such as waffle-iron filter, mechanical RF filter, etc. RF filters are usually placed when there is need to pass an electrical wire in or out of an MRD enclosure to ensure that the EMI does not couple on the conductive wiring. These filters could be of passive components such as a combination of inductors and capacitors.

The term "Physical damage shielding means" interchangeably refers hereinafter to any mean that creates at a partial protective layer (actual or virtual) over an object. This is achieved by means such as a foam coating, layering of absorptive material, projections from the object protecting against damage from large items, a wire mess or at least a partial cage from strong materials, protection against electrocution, water isolating coverage, fire resistant properties, etc.

The term "CPU-central processing unit" interchangeably refers hereinafter to the hardware within a computer that carries out the instructions of a computer program by performing the basic arithmetical, logical, and input/output operations of the system.

The term "sensing equipment" interchangeably refers hereinafter to any device that receives a signal or stimulus (heat, pressure, light, motion, sound, humidity etc.) and The term "user interface" interchangeably refers hereinafter to at least one defined area in which the user interacts with the thermo isolating jacket. This area harbors: passage for medical equipment, display, CPU, alarm system, monitoring system, power supply, open mechanism, close mechanism, indicators, etc. The user interface is designed for the handler, user or both.

The term "module" interchangeably refers hereinafter to a structurally independent part, able to be connected and detached from the thermo isolating jacket. This module is connected itself or by another element in its contour, embedded, integrated, placed, interconnected, etc. to the thermo isolating jacket.

The term "visual indicators" interchangeably refers hereinafter to a representation of light in the visible light range of about 380 nanometers to about 740 nm. More generally the terms refer to any light within the visible range that will be noticeable by the user of the invention (light, flashing light, flickering light, blinking light, change of spectrum of colors of light etc.).

The term "audible indicators" interchangeably refers hereinafter to a representation of sound, typically as an electrical voltage. Audible indicators have frequencies in the audio frequency range of roughly 20 to 20,000 Hz (the limits of human hearing). Audible indicators are either synthesized directly, or originate at a transducer such as a microphone, musical instrument pickup, phonograph cartridge, or tape head.

The term "sensible indicators" interchangeably refers hereinafter to a physical movement of at least a portion of the user interface, which is noticeable to the user (shaking, vibrating, quivering, etc.).

The term "predetermined values" interchangeably refers hereinafter to physical values of such as temperature, humidity, gas flow, gas concentration, sound pressure levels, vibrations, drift, electricity, radio frequency; system values such data transfer, opened or closed state of thermo isolating jacket, structural integrity of thermo isolating jacket, structural integrity of interconnected parts, general function of MRD, general function of thermo isolating jacket, all of which have a desired value or value range that is predefined to fit a specific action.

The term "fastener" interchangeably refers hereinafter to a mechanism or device that maintains the structural integrity a selected from a group consisting of: the thermo isolating jacket itself, its connected parts and modules, the thermo isolating jacket door in a closed position, the thermo isolating jacket together with the MRD, the thermo isolating jacket together with the MRD further connected to a third party, and any combination thereof. Further, this mechanism is such as a belt, strip, fastener, draw latch, latch, lock, bolt, grip, bar, bond, clamp, clasp, connection, fixture, link, hook, hasp, buckle, harness, clip, snap, pin, peg, grapnel, screw, fitting, slide, track, joint, interweave, coupler, chain, implant, staple, cover, layer, connector, inter-connector, insert, hold, ring, etc.

The term "hinge" interchangeably refers hereinafter to any maneuverable connection for rotational motion between the current invention parts, portions and modules, such as a flexible mechanism or material, joint, hook, thread, axis, juncture, fold, bend, elbow, knee, corner, fork, axis, pole, ball and socket, condyloid joint, mechanical device, fold hinge, joint, bearing, barrel hinge, pivot hinges, butt/mortise hinges, case hinges, continuous hinges, piano hinges, concealed hinges, cup hinge, euro hinge, butterfly hinges, parliament hinges, dovetail hinges, flag hinges, flag hinge, strap hinges, H hinges, HL hinges, counter-flap hinge, flush hinge, coach hinge, rising butt hinge, double action spring hinge, tee hinge, friction hinge, security hinge, cranked hinge, lift-off hinge, self-closing hinge, butt hinge, butler tray hinge, card table hinge, drop leaf table hinge, floating hinge, living hinge, and any combination thereof.

The term "pivot pin" interchangeably refers hereinafter to any maneuverable connection for rotational motion between the current invention parts, portions and modules at least partially around a pivot point.

The term "sliding mechanism", interchangeably refers hereinafter to a mechanism in with a body is movable in a sliding motion along a track. A portion of the movable body is mounted on, suspended from, inserted to, threaded to, interweaved with, integrated to, fitted to, following, etc. a track. In reference to a physical track, the connection of the moveable portion to the track is directly by geometrical shape fit of on part with the other and/or via a third element such as wheels, rack wheels, ball bearings, rollers, rolling discs, lubricant, location guide, belts, pulleys etc. In reference to a virtual motion track, the movable portion is connected to a sliding motion providing mechanism such as telescopic arms, folding arms, arms, angled arms, etc. connected at a pivotal point, allowing for sliding movement along a predefined virtual path. In addition this sliding mechanism may enable straight sliding, curved sliding, folding slide, sliding around a corner, rolling door sliding, etc.

The term "power supply" interchangeably refers hereinafter to a source of power such as electrical power generated from internally supplied DC, externally supplied AC or DC, or both, other energy sources that may be used directly such as solar energy.

The term "medical equipment tubing" interchangeably refers hereinafter to all tubes, cables, connectors, wires, liquid carriers, gas carriers, electrical wires, monitoring cables, viewing cables, data cables, etc., that is used in connection to life support equipment, medical equipment or physical environment maintenance or monitoring.

The value of n interchangeably refers to any integer.

According to one embodiment of the present invention, a thermal isolating jacket for a magnetic resonance device (MRD), configured to be positioned in an atmospheric pressure system, temperature changing environment, having at least one first temperature T1 [° C.] and a Q [kj] amount of heat applied to the same, in which: (a) an inner portion fitted by means of size and shape to the external dimensions of the MRD; (b) at least one second temperature T2 [° C.] in the inner portion; (c) a specific mass, m [kg]; and, (d) specific heat capacity, Cp [kj/kg]; wherein the following formula is being held true: Q=Cp m dT; where dT=T1−T2, wherein for each applied Q, dT2 is in the range of 0° C.-0.2° C.; where dT2=T2+dT.

According to another embodiment of the invention, a thermo isolating jacket as defined above is disclosed, wherein at least a portion of the jacket comprising n layers.

According to another embodiment of the invention, a thermo isolating jacket as defined above is disclosed, wherein at least 2 of the n layers comprising a substantially different specific heat capacity $C_p$ for each layer; where each of the layers has at least one first temperature $H_1$ [° C.] measured on the outer side of the layer, and at least one first temperature $H_2$ [° C.], measured on its inner side towards the MRD, having a $dH_1$− . . . $dH_n$, where dT of thermo isolating jacket equals $H_1$−$H_n$.

According to another embodiment of the invention at least a portion of the layered construction is at least one selected from a group consisting of: air space, container, liquid, thermally insulating materials, structural support, liquid isolating materials, and any combination thereof.

According to another embodiment of the invention, a thermo isolating jacket as defined above is disclosed, wherein the jacket comprising at least one opening to permit access to the MRD.

According to another embodiment of the invention, a thermo isolating jacket as defined above is disclosed, wherein at least a portion of the thermo isolating jacket comprising a material selected from a group consisting of: thermo insulating material, sealing material, foam material, fire retardant materials, at least partially transparent material and any combination thereof.

According to another embodiment of the invention, a thermo isolating jacket as defined above is disclosed, wherein at least a portion of the thermo isolating jacket comprises shielding selected from a group consisting of: magnetic shielding, RF shielding, physical shielding and any combination thereof.

According to another embodiment of the invention, a thermo isolating jacket as defined above is disclosed, wherein the thermo isolating jacket comprises a conduit having at least one first aperture to the MRD bore and at least one aperture to the external environment, fitted for the passage of tubing within; further wherein the conduit is configured to attenuate the passage of frequencies selected from a group consisting of: 0 to about 1000 MHz, 0 to about 500 MHz, 0 to about 200 MHz and any combination thereof.

According to another embodiment of the invention, a thermo isolating jacket as defined above is disclosed, wherein the conduit is configured to attenuate electromagnetic interference by means selected from a group consisting of: waveguide, RF filter, waveguide filter, attenuating material, and any combination thereof.

According to another embodiment of the invention at least a portion comprising electro-conductive material.

According to another embodiment of the invention at least a portion of the jacket closes a conductive circuit around the MRD.

According to another embodiment of the invention, a thermo isolating jacket as defined above is disclosed, wherein the jacket is connected to the MRD operating system.

According to another embodiment of the invention, a thermo isolating jacket as defined above is disclosed, wherein the jacket comprising modular pieces reversibly connectable to form the thermo isolating jacket.

According to another embodiment of the invention, a thermo isolating jacket as defined above is disclosed, wherein the jacket comprises at least one fastener to secure a selected from a group consisting of: a connection between the MRD and the thermo isolating jacket, structural integrity of the thermo isolating jacket, and any combination thereof.

According to another embodiment of the invention, a thermo isolating jacket as defined above is disclosed, wherein at least a portion comprising channels for passage of a substance selected from a group consisting of: gas, liquid, or any combination thereof.

According to another embodiment of the invention, at least a portion of the channels are coated with a material selected from a group consisting of: thermally insulating material, liquid insulating material, thermally conducting material, gas insulating material and any combination thereof.

According to another embodiment of the invention, a thermo isolating jacket as defined above is disclosed, wherein at least a portion comprises an active thermo regulating system.

According to another embodiment of the invention, a thermo isolating jacket as defined above is disclosed, wherein the system is configured to a setting selected from a group consisting of: maintain a predetermined temperature, operate only when a predetermined temperature has been measured within the inner volume, respond to temperature changes in the external environment, operate only within a predetermined temperature range, shut down at a predetermined temperature and any combination thereof.

According to another embodiment of the invention, a thermo isolating jacket as defined above is disclosed, wherein at least a portion of the jacket comprising a passive thermo-regulating envelope surrounding an active thermo-regulating system.

According to another embodiment of the invention, a thermo isolating jacket as defined above is disclosed, wherein the thermo isolating jacket comprises at least one sensor selected from a group consisting of: temperature sensors, EMI sensors, magnetic sensors, vibration sensors, connection sensors, and any combination thereof.

According to another embodiment of the invention, a thermo isolating jacket as defined above is disclosed, comprising temperature sensors, wherein the sensors are configured to sense the inner volume temperature, the external environment temperature or both.

According to another embodiment of the invention, a thermo isolating jacket as defined above is disclosed, wherein the thermo isolating jacket is connected to a component selected from a group consisting of: a CPU, an alarm system, at least one indicator, at least one sensor, and any combination thereof.

According to another embodiment of the invention, a thermo isolating jacket as defined above is disclosed, wherein at least a portion comprising a user interface.

According to one embodiment of the invention, a thermal isolating jacket for a magnetic resonance device (MRD) having an external dimensions A $[m^2]$, configured to be positioned in an atmospheric pressure, temperature changing environment, having at least one first temperature $T_1$ [° C.] and at least one second temperature $T_2$ [° C.], in which: (a) an inner portion fitted by means of size and shape to the external dimensions of the MRD; (b) thermal conductivity, k [W/m ° C.]; (c) thickness, s [m]; and, (d) conductive heat transfer, q [W]; wherein the following formula is being held true:

$$q = kAdT/s, \text{ where } dT \text{ equals } T_2 - T_1 \text{ and } q << 0.01 \text{ W.}$$

According to another embodiment of the invention, a thermo isolating jacket as defined above is disclosed, wherein at least a portion of the jacket comprising n layers.

According to another embodiment of the invention, a thermo isolating jacket as defined above is disclosed, wherein at least 2 of the n layers comprising a substantially different conductive heat transfer value q for each layer; where each of the layers has at least one first temperature $H_1$ [° C.] measured on the outer side of the layer, and at least one first temperature $H_2$ [° C.], measured on its inner side towards the MRD, having a $dH_1 - \ldots dHn$, where dT of thermo isolating jacket equals $H_1 - Hn$.

According to another embodiment of the invention at least a portion of the layered construction is at least one selected from a group consisting of: air space, container, liquid, thermally insulating materials, structural support, liquid isolating materials, and any combination thereof.

According to another embodiment of the invention, a thermo isolating jacket as defined above is disclosed, wherein the jacket comprising at least one opening to permit access to the MRD.

According to another embodiment of the invention, a thermo isolating jacket as defined above is disclosed, wherein at least a portion of the thermo isolating jacket comprising a material selected from a group consisting of: thermo insulating material, sealing material, foam material, fire retardant materials, at least partially transparent material and any combination thereof.

According to another embodiment of the invention, a thermo isolating jacket as defined above is disclosed, wherein at least a portion of the thermo isolating jacket comprises shielding selected from a group consisting of: magnetic shielding, RF shielding, physical shielding and any combination thereof.

According to another embodiment of the invention, a thermo isolating jacket as defined above is disclosed, wherein the thermo isolating jacket comprises a conduit having at least one first aperture to the MRD bore and at least one aperture to the external environment, fitted for the passage of tubing within; further wherein the conduit is configured to attenuate the passage of frequencies selected from a group consisting of: 0 to about 1000 MHz, 0 to about 500 MHz, 0 to about 200 MHz and any combination thereof.

According to another embodiment of the invention, a thermo isolating jacket as defined above is disclosed, wherein the conduit is configured to attenuate electromagnetic interference by means selected from a group consisting of: waveguide, RF filter, waveguide filter, attenuating material, and any combination thereof.

According to another embodiment of the invention at least a portion comprising electro-conductive material.

According to another embodiment of the invention at least a portion of the jacket closes a conductive circuit around the MRD.

According to another embodiment of the invention, a thermo isolating jacket as defined above is disclosed, wherein the jacket is connected to the MRD operating system.

According to another embodiment of the invention, a thermo isolating jacket as defined above is disclosed, wherein the jacket comprising modular pieces reversibly connectable to form the thermo isolating jacket.

According to another embodiment of the invention, a thermo isolating jacket as defined above is disclosed, wherein the jacket comprises at least one fastener to secure a selected from a group consisting of: a connection between the MRD and the thermo isolating jacket, structural integrity of the thermo isolating jacket, and any combination thereof.

According to another embodiment of the invention, a thermo isolating jacket as defined above is disclosed, wherein at least a portion comprising channels for passage of a substance selected from a group consisting of: gas, liquid, or any combination thereof.

According to another embodiment of the invention, at least a portion of the channels are coated with a material selected from a group consisting of: thermally insulating material, liquid insulating material, thermally conducting material, gas insulating material and any combination thereof.

According to another embodiment of the invention, a thermo isolating jacket as defined above is disclosed, wherein at least a portion comprises an active thermo regulating system.

According to another embodiment of the invention, a thermo isolating jacket as defined above is disclosed, wherein the system is configured to a setting selected from a group consisting of: maintain a predetermined temperature, operate only when a predetermined temperature has been measured within the inner volume, respond to temperature changes in the external environment, operate only within a predetermined temperature range, shut down at a predetermined temperature and any combination thereof.

According to another embodiment of the invention, a thermo isolating jacket as defined above is disclosed, wherein at least a portion of the jacket comprising a passive thermo-regulating envelope surrounding an active thermo-regulating system.

According to another embodiment of the invention, a thermo isolating jacket as defined above is disclosed, wherein the thermo isolating jacket comprises at least one sensor selected from a group consisting of: temperature sensors, EMI sensors, magnetic sensors, vibration sensors, connection sensors, and any combination thereof.

According to another embodiment of the invention, a thermo isolating jacket as defined above is disclosed, comprising temperature sensors, wherein the sensors are configured to sense the inner volume temperature, the external environment temperature or both.

According to another embodiment of the invention, a thermo isolating jacket as defined above is disclosed, wherein the thermo isolating jacket is connected to a component selected from a group consisting of: a CPU, an alarm system, at least one indicator, at least one sensor, and any combination thereof.

According to another embodiment of the invention, a thermo isolating jacket as defined above is disclosed, wherein at least a portion comprising a user interface.

According to one embodiment of the invention, a thermal isolating jacket for a magnetic resonance device (MRD) having an external dimensions A $[m^2]$, configured to be positioned in an atmospheric pressure system and a temperature changing environment having at least one first temperature $T_1$ [° C.] and at least one second temperature $T_2$ [° C.], the jacket is characterized by a thermal expansion coefficient substantially different than 0.

According to another embodiment of the invention, a thermo isolating jacket as defined above is disclosed, wherein at least a portion of the jacket comprising n layers.

According to another embodiment of the invention, a thermo isolating jacket as defined above is disclosed, wherein at least 2 of the n layers comprising a substantially different thermal expansion coefficient for each layer; where each of the layers has at least one first temperature $H_1$ [° C.] measured on the outer side of the layer, and at least one first temperature $H_2$ [° C.], measured on its inner side towards the MRD, having a $dH_1 - \ldots dHn$, where dT of thermo isolating jacket equals $H_1 - Hn$.

According to another embodiment of the invention at least a portion of the layered construction is at least one selected from a group consisting of: air space, container, liquid, thermally insulating materials, structural support, liquid isolating materials, and any combination thereof.

According to another embodiment of the invention, a thermo isolating jacket as defined above is disclosed, for an MRD having a length $L_{0,MRD}$ [m]; the jacket is further characterized by: an inner portion fitted by means of size and shape to the external dimensions A of the MRD; length $L_{0, Jacket}$ [m] fitted by means of size and shape to the $L_{0,MRD}$; and linear thermal expansion coefficient $\alpha_L$ [° C.$^{-1}$] substantially different than 0; wherein if dT substantially different than 0; the length $L_{0, Jacket}$ will be varied to $L_{1, Jacket}$, such that the formula is being held true for any change in temperature, dT:

$$\alpha_L = \frac{1}{L}\frac{dL}{dT}$$

where dL equals $L_{1, Jacket} - L_{0, Jacket}$ and dT equals $T_2 - T_1$.

According to another embodiment of the invention, a thermo isolating jacket as defined above is disclosed, the jacket is further characterized by: an inner portion fitted by means of size and shape to the external dimensions A of the MRD; volume $V_{0\ Jacket}$ [m]; and volumetric thermal expansion coefficient $\alpha_V$ [° C.$^{-1}$] substantially different than 0; wherein if dT substantially different than 0; the volume $V_{0, Jacket}$ will be varied to $V_{1, Jacket}$, such that the formula is being held true for any change in temperature, dT:

$$\alpha_V = \frac{1}{V}\left(\frac{\partial V}{\partial T}\right)$$

where dV equals $V_{1, Jacket} - V_{0, Jacket}$ and dT equals $T_2 - T_1$.

According to another embodiment of the invention, a thermo isolating jacket as defined above is disclosed, the jacket is further characterized by: an inner portion fitted by means of size and shape to the external dimensions A of the MRD; area $A_{0, Jacket}$ [m$^2$]; and area thermal expansion coefficient $\alpha_A$ [° C.$^{-1}$] substantially different than 0; wherein if dT substantially different than 0; the length $A_{0, Jacket}$ will be varied to $A_{1, Jacket}$, such that the formula is being held true for any change in temperature, dT:

$$\alpha_A = \frac{1}{A}\frac{dA}{dT}$$

where dA equals $A_{1, Jacket} - A_{0, Jacket}$ and dT equals $T_2 - T_1$.

According to another embodiment of the invention, a thermo isolating jacket as defined above is disclosed, wherein the jacket comprising at least one opening to permit access to the MRD.

According to another embodiment of the invention, a thermo isolating jacket as defined above is disclosed, wherein at least a portion of the thermo isolating jacket comprising a material selected from a group consisting of: thermo insulating material, sealing material, foam material, fire retardant materials, at least partially transparent material and any combination thereof.

According to another embodiment of the invention, a thermo isolating jacket as defined above is disclosed, wherein at least a portion of the thermo isolating jacket comprises shielding selected from a group consisting of: magnetic shielding, RF shielding, physical shielding and any combination thereof.

According to another embodiment of the invention, a thermo isolating jacket as defined above is disclosed, wherein the thermo isolating jacket comprises a conduit having at least one first aperture to the MRD bore and at least one aperture to the external environment, fitted for the passage of tubing within; further wherein the conduit is configured to attenuate the passage of frequencies selected from a group consisting of: 0 to about 1000 MHz, 0 to about 500 MHz, 0 to about 200 MHz and any combination thereof.

According to another embodiment of the invention, a thermo isolating jacket as defined above is disclosed, wherein the conduit is configured to attenuate electromagnetic interference by means selected from a group consisting of: waveguide, RF filter, waveguide filter, attenuating material, and any combination thereof.

According to another embodiment of the invention, a thermo isolating jacket as defined above is disclosed, wherein at least a portion comprising electro-conductive material.

According to another embodiment of the invention, a thermo isolating jacket as defined above is disclosed, wherein at least a portion of the jacket closes a conductive circuit around the MRD.

According to another embodiment of the invention, a thermo isolating jacket as defined above is disclosed, wherein the jacket is connected to the MRD operating system.

According to another embodiment of the invention, a thermo isolating jacket as defined above is disclosed, wherein the jacket comprising modular pieces reversibly connectable to form the thermo isolating jacket.

According to another embodiment of the invention, a thermo isolating jacket as defined above is disclosed, wherein the jacket comprises at least one fastener to secure a selected from a group consisting of: a connection between the MRD and the thermo isolating jacket, structural integrity of the thermo isolating jacket, and any combination thereof.

According to another embodiment of the invention, a thermo isolating jacket as defined above is disclosed, wherein at least a portion comprising channels for passage of a substance selected from a group consisting of: gas, liquid, or any combination thereof.

According to another embodiment of the invention, at least a portion of the channels are coated with a material selected from a group consisting of: thermally insulating material, liquid insulating material, thermally conducting material, gas insulating material and any combination thereof.

According to another embodiment of the invention, a thermo isolating jacket as defined above is disclosed, wherein at least a portion comprises an active thermo regulating system.

According to another embodiment of the invention, a thermo isolating jacket as defined above is disclosed, wherein the system is configured to a setting selected from a group consisting of: maintain a predetermined temperature, operate only when a predetermined temperature has been measured within the inner volume, respond to temperature changes in the external environment, operate only within a predetermined temperature range, shut down at a predetermined temperature and any combination thereof.

According to another embodiment of the invention, a thermo isolating jacket as defined above is disclosed, wherein at least a portion of the jacket comprising a passive thermo-regulating envelope surrounding an active thermo-regulating system.

According to another embodiment of the invention, a thermo isolating jacket as defined above is disclosed, wherein the thermo isolating jacket comprises at least one sensor selected from a group consisting of: temperature sensors, EMI sensors, magnetic sensors, vibration sensors, connection sensors, and any combination thereof.

According to another embodiment of the invention, a thermo isolating jacket as defined above is disclosed, comprising temperature sensors, wherein the sensors are configured to sense the inner volume temperature, the external environment temperature or both.

According to another embodiment of the invention, a thermo isolating jacket as defined above is disclosed, wherein the thermo isolating jacket is connected to a component selected from a group consisting of: a CPU, an alarm system, at least one indicator, at least one sensor, and any combination thereof.

According to another embodiment of the invention, a thermo isolating jacket as defined above is disclosed, wherein at least a portion comprising a user interface.

Reference is now made to FIG. 1A schematically illustrating, in an out of scale manner, an embodiment of the invention. The rectangular embodiment of a thermo isolating jacket (100) completely encasing an MRD (800), having an MRD bore (850). In this embodiment the jacket is constructed from two pieces presented by the dividing horizontal line (80), thereby enabling insertion of the MRD into the jacket.

Figure 1B:
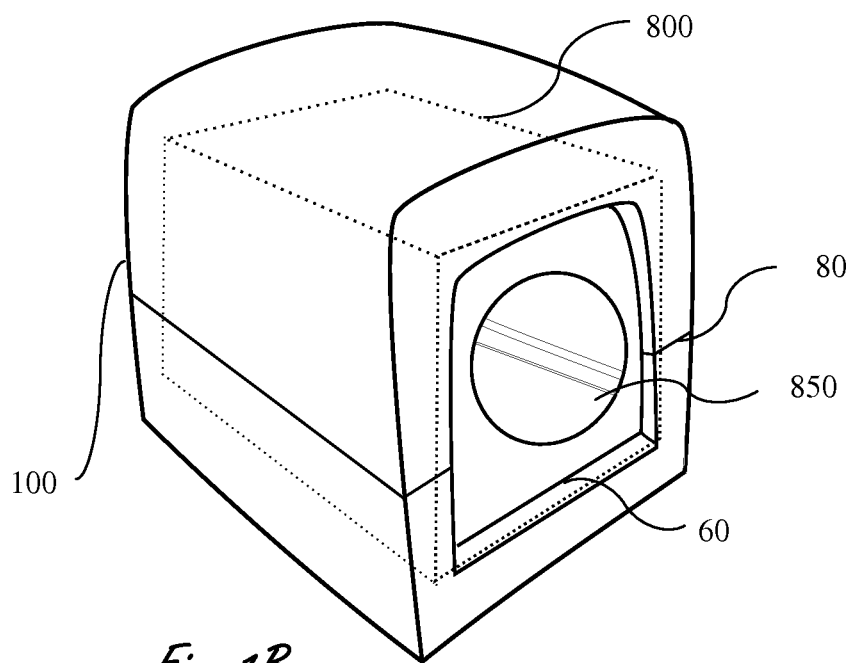
FIG. 1B is a schematic illustration of an MRD thermo isolating jacket.

Reference is now made to FIG. 1B schematically illustrating, in an out of scale manner, an embodiment of the invention. An embodiment of a jacket (100), encasing an MRD (800), having an opening (60) to enable access to the MRD bore (850). In this embodiment the thermo isolating jacket is constructed from two pieces presented by the dividing vertical line (80), thereby enabling insertion of the MRD into the thermo isolating jacket.

Figure 2:
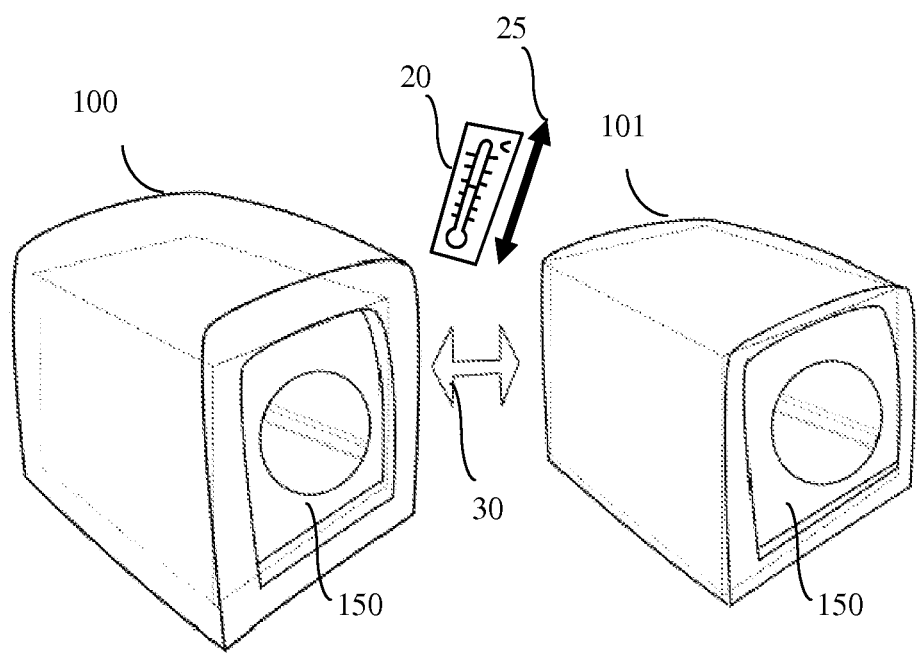
FIG. 2 is a schematic illustration of an MRD thermo isolating jacket comprising thermal mass expansion properties.

Reference is now made to FIG. 2 schematically illustrating, in an out of scale manner, an embodiment of the invention. In this embodiment a thermo isolating jacket (101) is installed around an MRD (150). This MRD comprises at least a portion of a material with thermal expansion properties so that the thermal expansion co-efficient in substantially different than 0. As the temperature measured (20) of the environment changes (25), the surface area properties of the thermo isolating jacket change (30), for example grow to a different size (100) depending on the temperature change, and so the temperature of the MRD remains relatively stable in reference to the environment temperature. In an embodiment the temperature change could be manifested in the thermo isolating jacket in thermal mass expansion or compression that can be measured linearly, volumetrically, or by measuring change in the surface area.

Figure 3A:
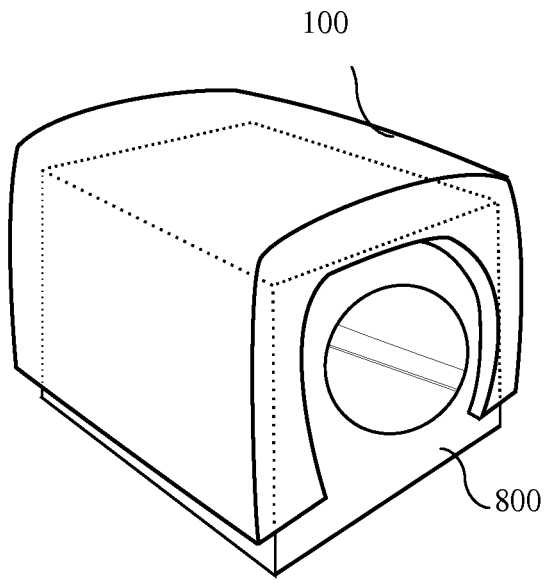
FIG. 3A is a schematic illustration of an MRD thermo isolating jacket embodied as a partial cover.

Reference is now made to FIG. 3A schematically illustrating, in an out of scale manner, an embodiment of the invention. In this embodiment the thermo isolating jacket (100) is partially covering the MRD (800), as a one piece canopy.

Figure 3B:
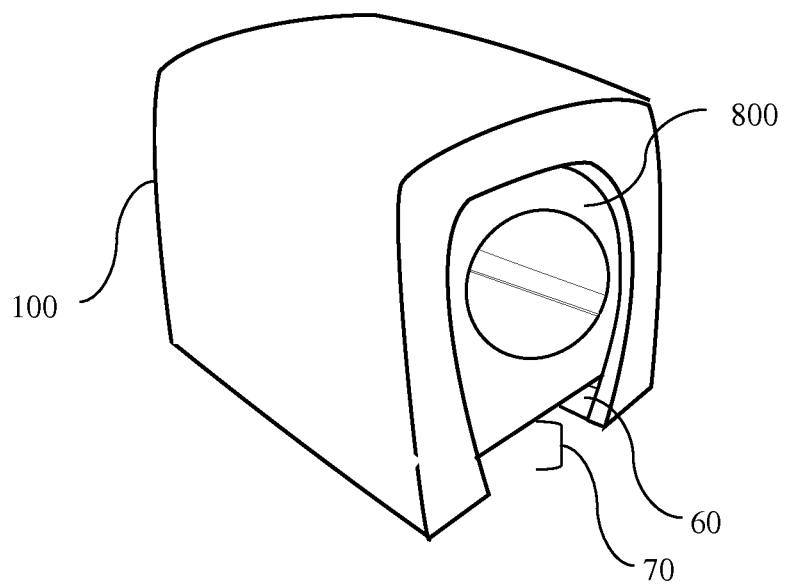
FIG. 3B is a schematic illustration of an MRD thermo isolating jacket embodied comprising elevation of the MRD.

Reference is now made to FIG. 3B schematically illustrating, in an out of scale manner, an embodiment of the invention. In this embodiment the thermo isolating jacket (100) is partially covering the MRD (800), having an opening (60) providing access to the MRD bore. The thermo isolating jacket provides a placement for the MRD that is elevated from the ground (70), thereby providing a vented space beneath the MRD.

Figure 4:
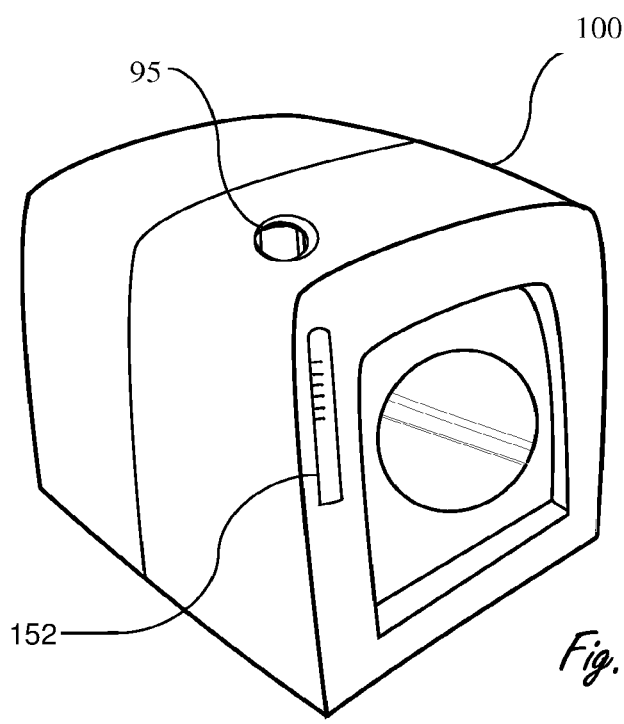
FIG. 4 is a schematic illustration of an MRD thermo isolating jacket embodied comprising a liquid or gas container.

Reference is now made to FIG. 4 schematically illustrating, in an out of scale manner, an embodiment of the invention. The rectangular embodiment of a thermo isolating jacket (100) encasing an MRD. In this embodiment the thermo isolating jacket comprises a container with an opening to fill liquid, gas, gel, small solid pieces, etc. (95) and a meter to assess status thereof (temperature, volume, composition etc.).

Figure 5:
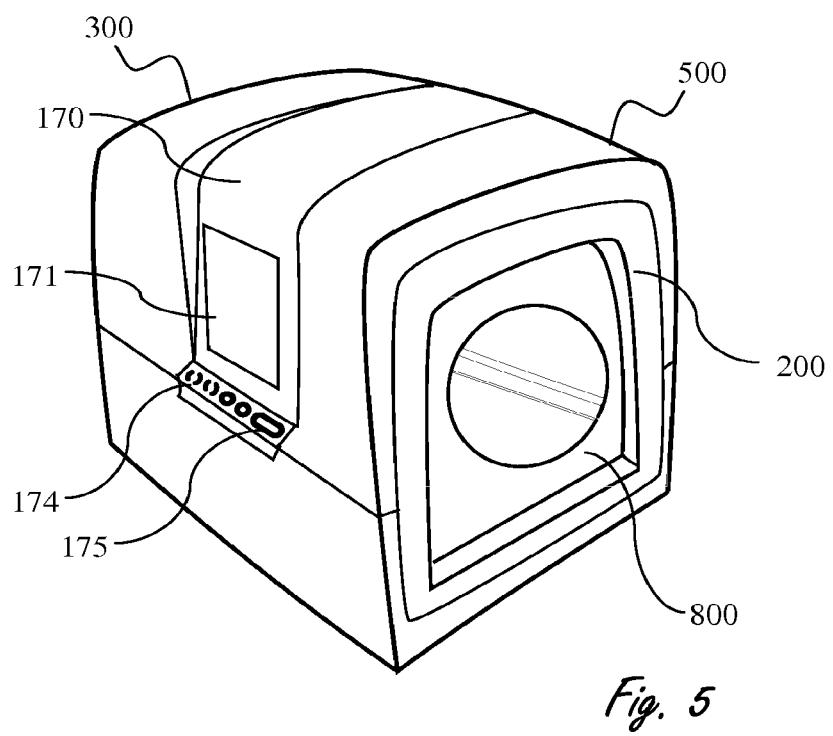
FIG. 5 is a schematic illustration of an MRD thermo isolating jacket embodied as nested shells comprising an active thermo-regulating system enclosed by a passive temperature regulation system.
Figure 6A:
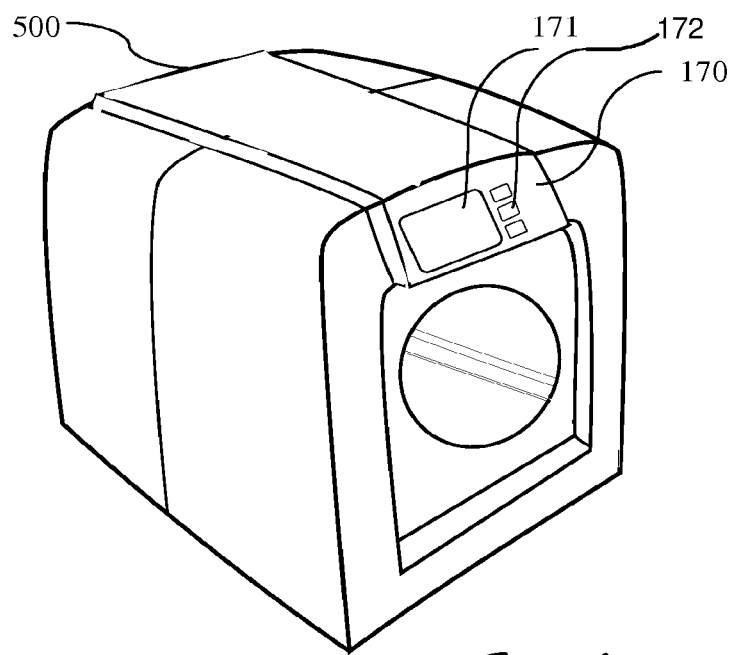
FIG. 6A is a schematic illustration of an MRD thermo isolating jacket embodied comprising a fastener and a front facing user interface.

Reference is now made to FIG. 5 schematically illustrating, in an out of scale manner, an embodiment of the invention. In this embodiment the thermo isolating jacket (100) is embodied as nested shells comprising an active thermo-regulating system (200) enclosed by a passive thermo-regulating system (500). An active thermo-regulating system's engine is placed in the back portion of the thermo isolating jacket (300). This embodiment further harbors a user interface module (170) having a display screen (171), indicators (174) and operating buttons (175);

Reference is now made to FIG. 6A schematically illustrating, in an out of scale manner, an embodiment of the invention. In this embodiment the MRD thermo isolating jacket (100) comprises a fastener part (500) holding the parts of the MRD together, and a front facing user interface (170) having a display screen (171) and indicators (172); In an embodiment the user interface is configured to control the MRD.

Figure 6B:
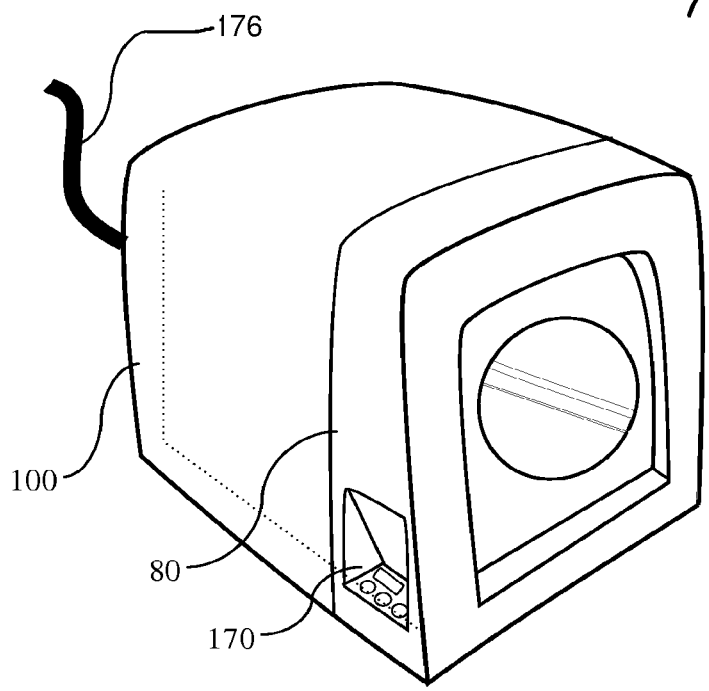
FIG. 6B is a schematic illustration of an MRD thermo isolating jacket embodied comprising a side facing user interface.

Reference is now made to FIG. 6B schematically illustrating, in an out of scale manner, an embodiment of the invention. In this embodiment the MRD thermo isolating jacket (100) comprises two unequal parts divided by the vertical line (80), and a side facing user interface (170) having a display screen (171), and an alarm system harboring indicators (visual, audible, sensible), and indicators (viewable indicators, auditable indicators, sensible indicators) (172); In an embodiment the alarm system is connected to a component selected from a group consisting of: sensors, visual indicators, audible indicators, sensible indicators, CPU, power supply, user interface, and any combination thereof. In an embodiment, the user interface further harbors an element such as control buttons, handles. In an embodiment the Thermo isolating jacket is connected to a power supply that is internally supplied DC, externally supplied AC or DC (176) or both.

Figure 7A:
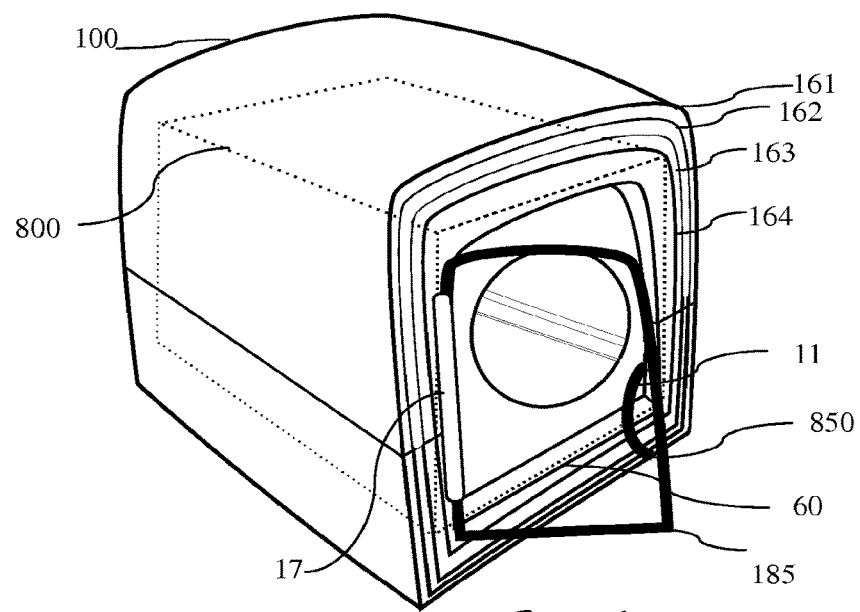
FIG. 7A is a schematic illustration of an MRD thermo isolating jacket embodied comprising a hinged door.

Reference is now made to FIG. 7A schematically illustrating, in an out of scale manner, an embodiment of the invention. In this embodiment the thermo isolating jacket (100) encasing an MRD (800) has an opening (60) permitting access to the MRD bore. The opening is closable by a door (185), additionally or alternatively at least partially transparent, connected by a maneuverable connection (17) such as a hinge. The door, having a handle (11), either permits or restricts access to the opening. This access is leading to such as the bore of the MRD, to the user interface of the MRD, to the connection of the MRD to third party elements, to the connections of the MRD to electricity, etc. Additionally or alternatively, the thermo isolating jacket acts as a passive electromagnetic shield. This can be achieved by forming the jacket as a casing (100) of conductive material or mesh thereby creating a faraday cage. The door (185) can be made with at least a portion of metallic material or compound. Another option is that the jacket (100) and the door (185) are coated with metal containing spray, metal plated, or constructed with conductive compound materials. In order to create an effective non-active magnetic shielding at least a portion of the jacket is constructed from magnetic alloys with high permeability and low coercivity such as Permalloy, and different types of Mu-metal. These are constructed from elements such as metal sheet, metal casting, metal screen, metal containing foam, metallic ink and any combination thereof. Further taking into consideration the possibility of creating Eddy currents, the jacket can be constructed with thin plates of conductive material, with metal coating or combined with capacitors to help dissipate these currents. Additionally or alternatively, the thermo isolating jacket comprises a multilayered construction (161, 162, 163, 164). Additionally or alternatively, at least one layer comprising a conducting portion providing RF shielding (161). Additionally or alternatively, at least one layer comprising passive thermo isolating material (162), wind proofing layer, fluid isolating layer or a combination thereof. Additionally or alternatively, at least one layer comprising a substantially different specific heat capacity Cp (163) than another layer (162). Additionally or alternatively, at least one layer comprising a substantially different conductive heat transfer value q (164) than a previous layer (163).

Figure 7B:
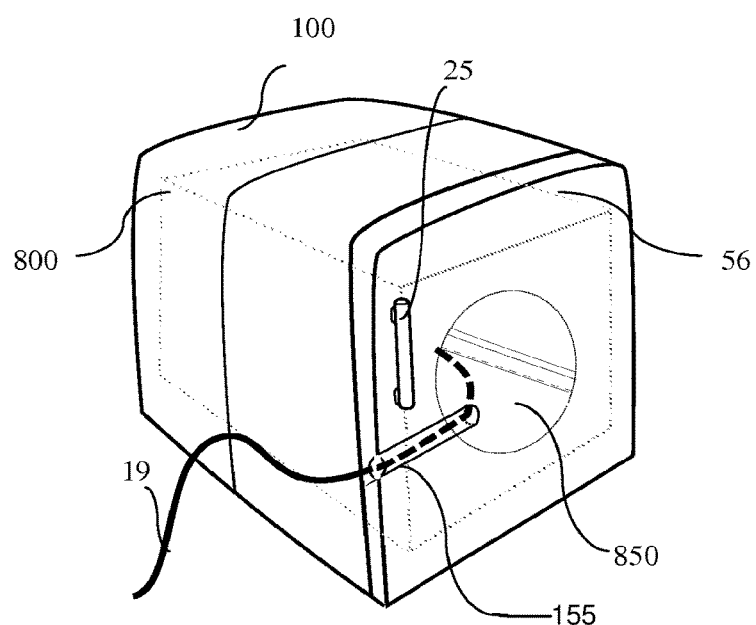
FIG. 7B is a schematic illustration of an MRD thermo isolating jacket embodied comprising a hinged door and an EMI shielding conduit.

Reference is now made to FIG. 7B schematically illustrating, in an out of scale manner, an embodiment of the invention. In this embodiment the thermo isolating jacket (100) encasing an MRD (800) has an opening permitting access to the MRD bore. The opening is closeable by a door (56), having a maneuverable connection such as a hinge, a pivot point, a sliding mechanism, a joint, telescopic arms, to either permit or restrict access to the opening, having a handle (25). Additionally or alternatively, the door (56) harbors an RF shielding conduit (155) sized and shaped for the passage of tubing (19) from the MRD to the external environment and contrariwise. The conduit having at least one first aperture to the MRD bore and at least one aperture to the external environment, is configured to attenuate the passage of frequencies selected from a group consisting of: 0 to about 1000 MHz, 0 to about 500 MHz, 0 to about 200 MHz and any combination thereof. The conduit is sized and shaped to allow passage of tubing from the MRD to the external environment and contrariwise. This access is leading to such as the bore of the MRD (850), to the user interface of the MRD, to the connection of the MRD to third party elements, to the connections of the MRD to electricity, etc. Additionally or alternatively the jacket comprises a manual or automatic mechanism for opening and closing the door. Additionally or alternatively, the thermo isolating jacket acts as a passive electromagnetic shield. This can be achieved by means of forming the jacket as a casing (100) of conductive material or mesh thereby creating a faraday cage. In this embodiment the door (56) is also made with at least a portion of metallic material or compound. Another option is that the jacket (100) and the door (56) are coated with metal containing spray, metal plated, or constructed with conductive compound materials. In order to create an effective non-active magnetic shielding at least a portion of the jacket is constructed from magnetic alloys with high permeability and low coercivity such as Permalloy, and different types of Mu-metal. These are constructed from elements such as metal sheet, metal casting, metal screen, metal containing foam, metallic ink and any combination thereof. Further taking into consideration the possibility of creating Eddy currents, the jacket can be constructed with thin plates of conductive material, with metal coating or combined with capacitors to help dissipate these currents. Additionally or alternatively, the jacket comprises an EMI shield configured to attenuate the passage of frequencies selected from a group consisting of: 0 to about 1000 MHz, 0 to about 500 MHz, 0 to about 200 MHz and any combination thereof. Additionally or alternatively the jacket comprises means for shielding from physical damage such as including strong shock absorptive materials, fluid isolating materials, non-abrasive coating, etc.

Figure 8:
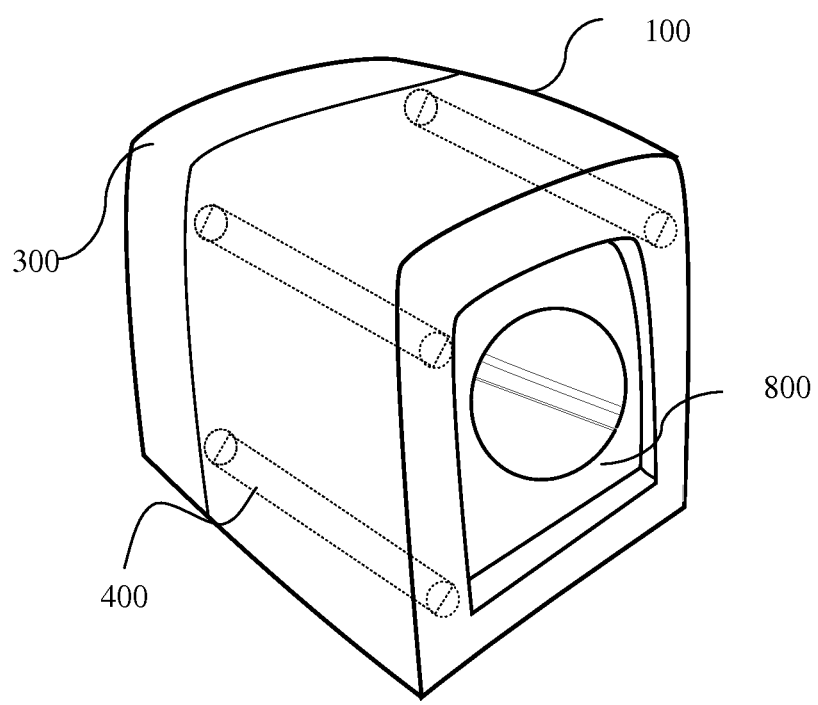
FIG. 8 is a schematic illustration of an MRD thermo isolating jacket embodied as comprising channels for thermo-regulating.

Reference is now made to FIG. 8 schematically illustrating, in an out of scale manner, an embodiment of the invention. In this invention the thermo isolating jacket (100) comprises horizontal channels (400) for thermo-regulating the MRD. These channels are further connected to an active thermo-regulating system located within (300). The active system is connected to a power supply that is internally supplied DC, externally supplied AC or DC or both.

Figure 9:
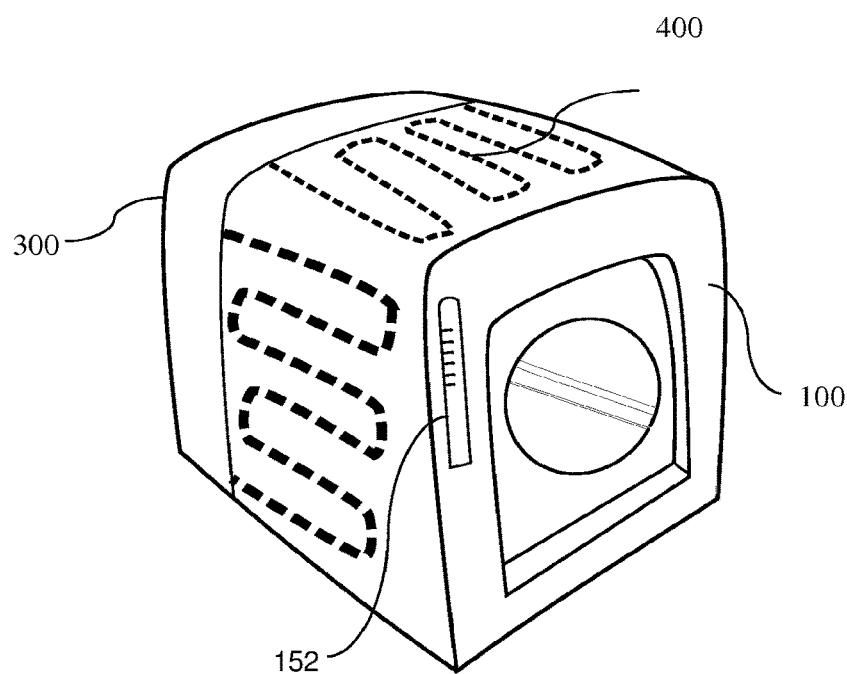
FIG. 9 is a schematic illustration of an MRD thermo isolating jacket embodied comprising channels for thermo-regulating.

Reference is now made to FIG. 9 schematically illustrating, in an out of scale manner, an embodiment of the invention. The rectangular embodiment of a thermo isolating jacket (100) comprising an active thermo-regulating system, harboring a thermo-regulating mechanism in the back portion (300) and comprising channels (400) for the passage of liquid and/or gas thermo-regulating, connected to this mechanism and passing along the MRD within the thermo isolating jacket. This embodiment further comprises an indicator (152) for temperature of the thermo isolating jacket inner volume.

Figure 10:
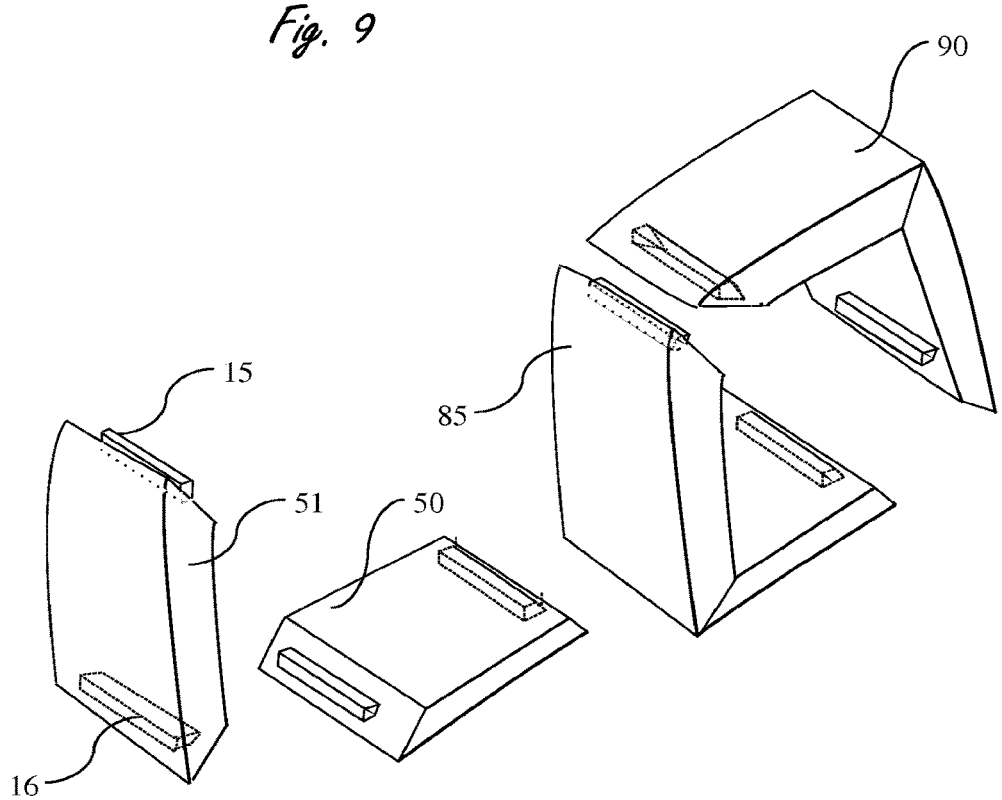
FIG. 10 is a schematic illustration of an embodiment of connectable parts of the MRD thermo isolating jacket.

Reference is now made to FIG. 10 schematically illustrating, in an out of scale manner, an embodiment of the invention. In this embodiment the thermo isolating jacket is comprised from modular pieces (50, 51), that have a projection (15) that fits in a designated socket (16). This embodiment enables disassembly of the jacket by the user and enables minimizing the storage space of the thermo isolating jacket. The figure shows parts (50) and (51) combining into pieces (85) and (90) as an example of construction. Further the thermo isolating jacket can be foldable, as to minimize space in storage. Additionally or alternatively, the modular pieces enable assembly of different thermo-isolating jackets according to different specifications by the user.

Additionally or alternatively, the modular pieces are provided in various embodiments having different sizes, different thermo isolating properties, different openings if any, different EMI shielding properties, different shielding from physical damage, different magnetic shielding, etc.

Reference is now made to FIG. 11A schematically illustrating, in an out of scale manner, an embodiment of the invention. In this embodiment, examples of parts of the thermo isolating jacket are shown. These parts are used as layers of the thermo isolating jacket or modular connecting parts thereof. Further In this embodiment the part (40) has a projection on one side (5) and a fitting socket (6) on the opposite side. The part is perforated (17) from top to bottom on the longitudinal axis of the part. These perforations are used for insulating air pockets and as placements for the transfer of channels, or other parts of an active thermo-regulating system. These perforations are also used for filling with other thermo-regulating materials, enhancing the passive temperature regulating qualities of the thermo isolating jacket.

Reference is now made to FIG. 11B schematically illustrating, in an out of scale manner, an embodiment of the invention. In this embodiment, examples of parts of the thermo isolating jacket are shown. This part (40) is used as layers of the thermo isolating jacket or modular connecting parts thereof. The part is perforated (18) from back to front on the horizontal axis of the part. These perforations are used for insulating air pockets and as placements for the transfer of channels, or other parts of an active thermo-regulating system. These perforations are also used for filling with other thermo-regulating materials, enhancing the passive thermo-regulating qualities of the thermo isolating jacket.

Reference is now made to FIG. 12 schematically illustrating, in an out of scale manner, an embodiment of the invention. In this embodiment, an example of a part of the thermo isolating jacket is shown. The part (40) is used as a layer of the thermo isolating jacket, comprising multiple corrugations and harbors a placement for a liquid, gas or solids container (90).

Figure 13:
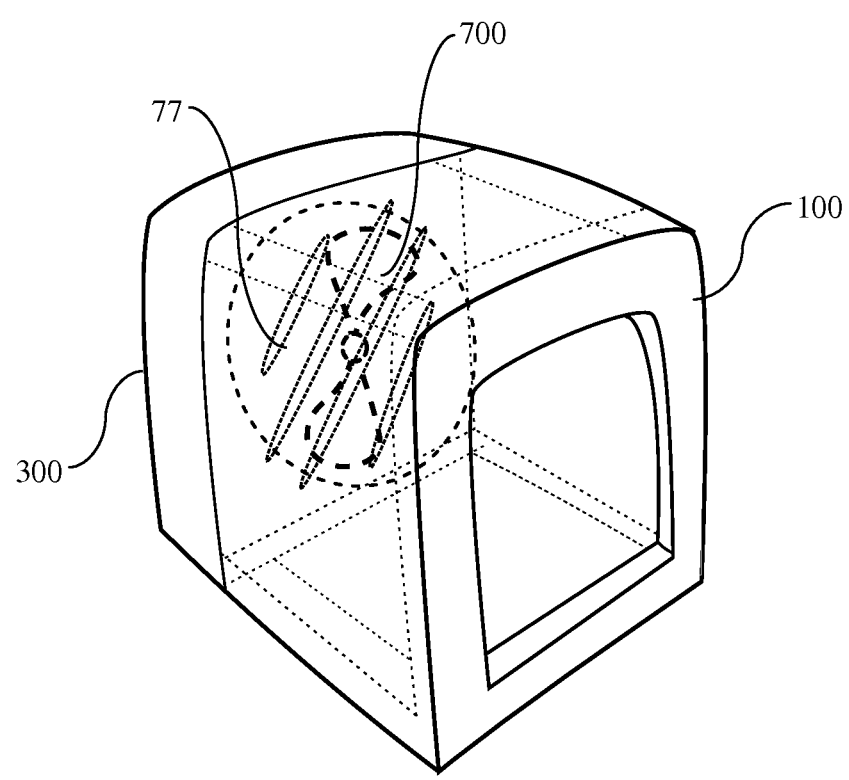
FIG. 13 is a schematic illustration of an MRD thermo isolating jacket embodied as comprising an active thermo-regulating system.

Reference is now made to FIG. 13 schematically illustrating, in an out of scale manner, an embodiment of the invention. In this embodiment, the thermo isolating jacket (100) is connected to a detachable thermo-regulating module (300) harboring a vent (700), and openings (77) for the passage of thermo-regulated air.

Figure 14:
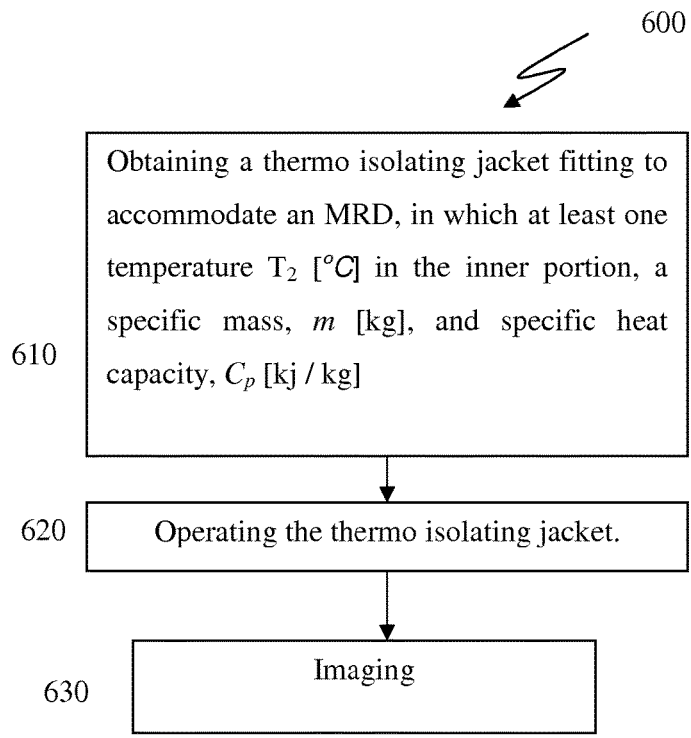
FIG. 14 is a schematic diagram of a method of the current invention describing a block diagram for thermo-regulating an MRD with a thermo isolating jacket.

Reference is now made to FIG. 14 schematically describing a flow diagram of a method (600) for thermo-regulating an MRD. Taking into consideration that the MRD is positioned in an atmospheric pressure system, temperature changing environment, having at least one first temperature $T_1$ [° C.] and a Q [kj] amount of heat applied to the same. The first step (610) is to obtain a thermo isolating jacket fitting to accommodate an MRD. The Thermo isolating jacket is characterized by an inner portion fitted by means of size and shape to the external dimensions of the MRD; at least one second temperature $T_2$ [° C.] in the inner portion; (iii) a specific mass, m [kg]; and (iv) specific heat capacity, $C_p$ [kj/kg]. The thermo isolating jacket is characterized by the following formula being held true: $Q=C_p$ m dT; where $dT=T_1-T_2$, for each applied Q, dT2 is in the range of 0° C.-0.2° C.; where $dT_2=T_2+dT$. The next step is operating the thermo isolating jacket on an MRD (620). In operating the thermo isolating jacket a user can install or connect the jacket to the MRD. In an embodiment this is achieved by methods such as: placing the thermo isolating jacket as a cover, encasing the MRD, inserting the MRD into a sleeve like structure, connecting two or more parts of the thermo isolating jacket around the MRD, etc. In an embodiment providing a fastener, attaching the MRD to the thermo isolating jacket, and/or to secure the integrity of the thermo isolating jacket parts. In an embodiment this step additionally comprises connecting third party elements such as power supply, active temperature regulating system. In an embodiment this step additionally comprises opening a door of am MRD opening in the thermo isolating jacket in order to gain access to the MRD after installing the thermo isolating jacket, etc. The following step is to image (630) the patient while thermo regulating the MRD.

Still referring to FIG. 14, according to another embodiment of the invention the step of obtaining a thermo isolating jacket additionally comprising selecting a thermo regulating jacket in which at least a portion is constructed of n layers.

Still referring to FIG. 14, according to another embodiment of the invention the step of obtaining a thermo isolating jacket additionally comprising selecting at least 2 of the n layers comprising a substantially different specific heat capacity $C_p$ for each layer; where each of the layers has at least one first temperature $H_1$ [° C.] measured on the outer side of the layer, and at least one first temperature $H_2$ [° C.], measured on its inner side towards the MRD, having a $dH_1- \ldots dHn$, where dT of thermo isolating jacket equals $H_1-Hn$.

According to another embodiment of the invention, method as defined above is disclosed, additionally comprising a step of selecting the thermo isolating jacket having at least one opening to permit access to the MRD.

According to another embodiment of the invention, method as defined above is disclosed, additionally comprising a step of selecting the thermo isolating jacket in which at least a portion is made with a material selected from a group consisting of: thermo insulating material, sealing material, foam material, fire retardant materials, at least partially transparent material and any combination thereof.

According to another embodiment of the invention, method as defined above is disclosed, additionally comprising a step of selecting the thermo isolating jacket in which at least a portion of having shielding selected from a group consisting of: magnetic shielding, RF shielding, physical shielding and any combination thereof.

According to another embodiment of the invention, method as defined above is disclosed, additionally comprising a step of selecting the thermo isolating jacket having a conduit attenuating the passage of frequencies selected from a group consisting of: 0 to about 1000 MHz, 0 to about 500 MHz, 0 to about 200 MHz and any combination thereof.

According to another embodiment of the invention, method as defined above is disclosed, additionally comprising a step of selecting the thermo isolating jacket having a conduit sized and shaped to permit passage of tubing from the MRD bore to the external environment and contrariwise.

According to another embodiment of the invention, method as defined above is disclosed, additionally comprising a step of the conduit attenuating electromagnetic interference by means selected from a group consisting of: waveguide, RF filter, waveguide filter, attenuating material, and any combination thereof.

According to another embodiment of the invention, method as defined above is disclosed, additionally comprising a step of selecting a thermo isolating jacket having at least a portion of electro-conductive material.

According to another embodiment of the invention, method as defined above is disclosed, additionally comprising a step of closing with at least a portion of the jacket, a conductive circuit around the MRD.

According to another embodiment of the invention, method as defined above is disclosed, additionally comprising a step of connecting the jacket to an operating system of the MRD.

According to another embodiment of the invention, method as defined above is disclosed, additionally comprising a step of assembling the jacket from modular pieces reversibly connecting to form the thermo isolating jacket.

According to another embodiment of the invention, method as defined above is disclosed, additionally comprising a step of securing a selected from a group consisting of: a connection between the MRD and the thermo isolating jacket, structural integrity of the thermo isolating jacket, and any combination thereof, with at least one fastener.

According to another embodiment of the invention, method as defined above is disclosed, additionally comprising a step of selecting the thermo isolating jacket in which at least a portion harbors channels for passing of a substance selected from a group consisting of: gas, liquid, or any combination thereof.

According to another embodiment of the invention, method as defined above is disclosed, additionally comprising a step of selecting the thermo isolating jacket in which at least a portion has an active thermo regulating system.

According to another embodiment of the invention, method as defined above is disclosed, additionally comprising a step of operating an active thermo regulating system, thereby heating or cooling the MRD.

According to another embodiment of the invention, method as defined above is disclosed, additionally comprising a step of configuring the to a setting selected from a group consisting of: maintain a predetermined temperature, operate only when a predetermined temperature has been measured within the inner volume, respond to temperature changes in the external environment, operate only within a predetermined temperature range, shut down at a predetermined temperature and any combination thereof.

According to another embodiment of the invention, method as defined above is disclosed, additionally comprising a step of selecting the thermo isolating jacket in which at least a portion of the jacket having a passive thermo-regulating envelope surrounding an active thermo-regulating system.

According to another embodiment of the invention, method as defined above is disclosed, additionally comprising a step of selecting the thermo isolating jacket having at least one sensor selected from a group consisting of: temperature sensors, EMI sensors, magnetic sensors, vibration sensors, connection sensors, and any combination thereof.

According to another embodiment of the invention, method as defined above is disclosed, additionally comprising a step of configuring the sensors to sense the inner volume temperature, the external environment temperature or both.

According to another embodiment of the invention, method as defined above is disclosed, additionally comprising a step of connecting the thermo isolating jacket to a component selected from a group consisting of: a CPU, an alarm system, at least one indicator, at least one sensor, and any combination thereof.

According to another embodiment of the invention, method as defined above is disclosed, additionally comprising a step of connecting at least a portion of the thermo isolating jacket to a user interface.

Figure 15:
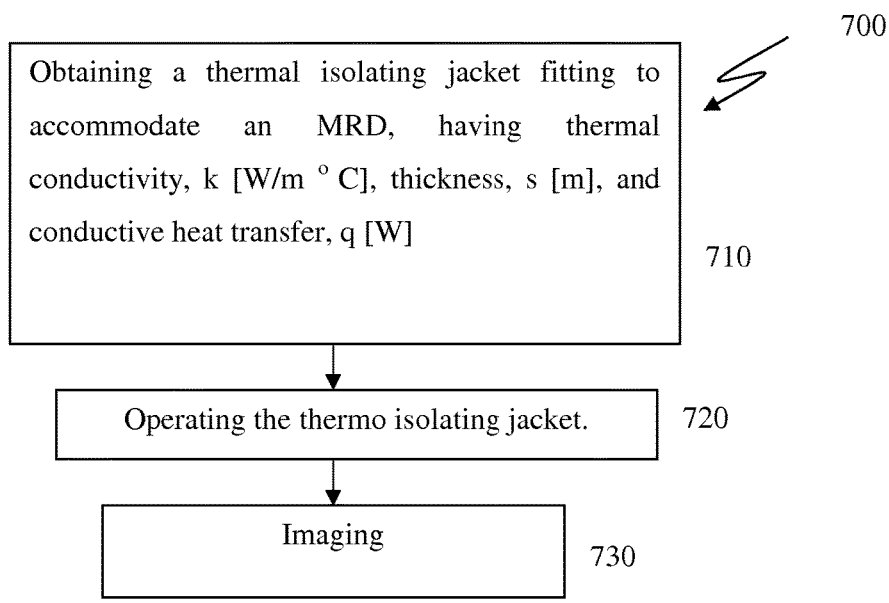
FIG. 15 is a schematic diagram of a method of the current invention describing a block diagram for thermo-regulating an MRD with a thermo isolating jacket.

Reference is now made to FIG. 15 schematically describing a flow diagram of a method (700) for thermo-regulating an MRD. Taking into consideration that the MRD having an external dimensions A $[m^2]$, is being positioned in atmospheric pressure, temperature changing environment, having at least one first temperature $T_1$ [° C.] and at least one second temperature $T_2$ [° C.]. The first step (710) is to obtain a thermo isolating jacket fitting to accommodate an MRD. The Thermo isolating jacket is characterized by an inner portion fitted by means of size and shape to the external dimensions A $[m^2]$ of the MRD; thermal conductivity, k [W/m ° C.]; thickness, s [m]; and conductive heat transfer, q [W]. The thermo isolating jacket is characterized by the following formula being held true: $q=k\,A\,dT/s$, where dT equals $T_2-T_1$ and $q<<0.01$ W. The next step is operating the thermo isolating jacket on an MRD (720). In operating the thermo isolating jacket a user can install or connect the jacket to the MRD. In an embodiment this is achieved by methods such as: placing the thermo isolating jacket as a cover, encasing the MRD, inserting the MRD into a sleeve like structure, connecting two or more parts of the thermo isolating jacket around the MRD, etc. In an embodiment providing a fastener, attaching the MRD to the thermo isolating jacket, and/or to secure the integrity of the thermo isolating jacket parts. In an embodiment this step additionally comprises connecting third party elements such as power supply, active temperature regulating system. In an embodiment this step additionally comprises opening a door of am MRD opening in the thermo isolating jacket in order to gain access to the MRD after installing the thermo isolating jacket, etc. The following step is to image (730) the patient while thermo regulating the MRD.

Still referring to FIG. 15, according to another embodiment of the invention the step of obtaining a thermo isolating jacket additionally comprising selecting a thermo regulating jacket in which at least a portion is constructed of n layers.

Still referring to FIG. 15, according to another embodiment of the invention the step of obtaining a thermo isolating jacket additionally comprising selecting at least 2 of the n layers having a substantially different conductive heat transfer value q for each layer; where each of the layers has at least one first temperature $H_1$ [° C.] measured on the outer side of the layer, and at least one first temperature $H_2$ [° C.], measured on its inner side towards the MRD, having a $dH_1- \ldots dHn$, where dT of thermo isolating jacket equals $H_1-Hn$.

According to another embodiment of the invention, method as defined above is disclosed, additionally comprising a step of selecting the thermo isolating jacket having at least one opening to permit access to the MRD.

According to another embodiment of the invention, method as defined above is disclosed, additionally comprising a step of selecting the thermo isolating jacket in which at least a portion is made with a material selected from a group consisting of: thermo insulating material, sealing material, foam material, fire retardant materials, at least partially transparent material and any combination thereof.

According to another embodiment of the invention, method as defined above is disclosed, additionally comprising a step of selecting the thermo isolating jacket in which at least a portion of having shielding selected from a group consisting of: magnetic shielding, RF shielding, physical shielding and any combination thereof.

According to another embodiment of the invention, method as defined above is disclosed, additionally comprising a step of selecting the thermo isolating jacket having a conduit fitting for the passage of tubing from the MRD to the external environment and contrariwise; further the conduit is configured to attenuating the passage of frequencies selected from a group consisting of: 0 to about 1000 MHz, 0 to about 500 MHz, 0 to about 200 MHz and any combination thereof.

According to another embodiment of the invention, method as defined above is disclosed, additionally comprising a step of the conduit attenuating electromagnetic interference by means selected from a group consisting of: waveguide, RF filter, waveguide filter, attenuating material, and any combination thereof.

According to another embodiment of the invention, method as defined above is disclosed, additionally comprising a step of selecting a thermo isolating jacket having at least a portion of electro-conductive material.

According to another embodiment of the invention, method as defined above is disclosed, additionally comprising a step of closing with at least a portion of the jacket, a conductive circuit around the MRD.

According to another embodiment of the invention, method as defined above is disclosed, additionally comprising a step of connecting the jacket to an operating system of the MRD.

According to another embodiment of the invention, method as defined above is disclosed, additionally comprising a step of assembling the jacket from modular pieces reversibly connecting to form the thermo isolating jacket.

According to another embodiment of the invention, method as defined above is disclosed, additionally comprising a step of securing a selected from a group consisting of: a connection between the MRD and the thermo isolating jacket, structural integrity of the thermo isolating jacket, and any combination thereof, with at least one fastener.

According to another embodiment of the invention, method as defined above is disclosed, additionally comprising a step of selecting the thermo isolating jacket in which at least a portion harbors channels for passing of a substance selected from a group consisting of: gas, liquid, or any combination thereof.

According to another embodiment of the invention, method as defined above is disclosed, additionally comprising a step of selecting the thermo isolating jacket in which at least a portion has an active thermo regulating system.

According to another embodiment of the invention, method as defined above is disclosed, additionally comprising a step of operating an active thermo regulating system, thereby heating or cooling the MRD.

According to another embodiment of the invention, method as defined above is disclosed, additionally comprising a step of configuring the to a setting selected from a group consisting of: maintain a predetermined temperature, operate only when a predetermined temperature has been measured within the inner volume, respond to temperature changes in the external environment, operate only within a predetermined temperature range, shut down at a predetermined temperature and any combination thereof.

According to another embodiment of the invention, method as defined above is disclosed, additionally comprising a step of selecting the thermo isolating jacket in which at least a portion of the jacket having a passive thermo-regulating envelope surrounding an active thermo-regulating system.

According to another embodiment of the invention, method as defined above is disclosed, additionally comprising a step of selecting the thermo isolating jacket having at least one sensor selected from a group consisting of: temperature sensors, EMI sensors, magnetic sensors, vibration sensors, connection sensors, and any combination thereof.

According to another embodiment of the invention, method as defined above is disclosed, additionally comprising a step of configuring the sensors to sense the inner volume temperature, the external environment temperature or both.

According to another embodiment of the invention, method as defined above is disclosed, additionally comprising a step of connecting the thermo isolating jacket to a component selected from a group consisting of: a CPU, an alarm system, at least one indicator, at least one sensor, and any combination thereof.

According to another embodiment of the invention, method as defined above is disclosed, additionally comprising a step of connecting at least a portion of the thermo isolating jacket to a user interface.

Figure 16:
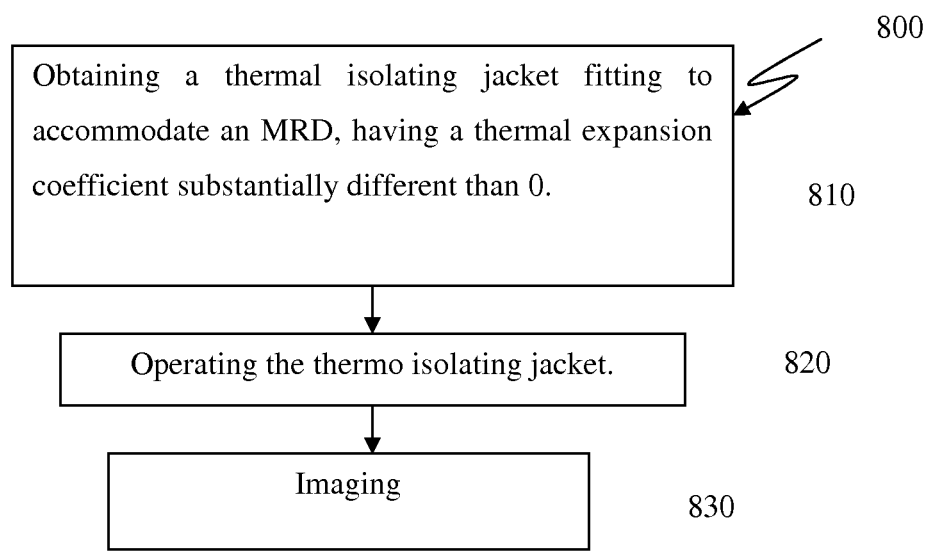
FIG. 16 is a schematic diagram of a method of the current invention describing a block diagram for thermo-regulating an MRD with a thermo isolating jacket.

Reference is now made to FIG. 16 schematically describing a flow diagram of a method (800) for thermo-regulating an MRD. Taking into consideration that the MRD having an external dimensions A [m²], being positioned in an atmospheric pressure and a temperature changing environment having at least one first temperature $T_1$ [° C.] and at least one second temperature $T_2$ [° C.]. The first step (810) is to obtain a thermo isolating jacket fitting to accommodate an MRD. The Thermo isolating jacket is characterized by jacket having a thermal expansion coefficient substantially different than 0.

Still referring to FIG. 16, the step of obtaining a thermo isolating jacket additionally comprises selecting an MRD having a length $L_{0,\ MRD}$ [m], and the jacket is further characterized by: (a) an inner portion fitted by means of size and shape to the external dimensions A of the MRD; (b) length $L_{0,\ Jacket}$ [m] fitted by means of size and shape to the $L_{0,MRD}$; and (C) linear thermal expansion coefficient $\alpha_L$ [° C.$^{-1}$] substantially different than 0; if dT substantially different than 0; the length $L_{0,\ Jacket}$ will be varied to $L_{1,\ Jacket}$, such that the formula is being held true for any change in temperature, dT:

$$\alpha_L = \frac{1}{L}\frac{dL}{dT}$$

where dL equals $L_{1,\ Jacket}-L_{0,Jacket}$ and dT equals $T_2-T_1$.

Still referring to FIG. 16, according to another embodiment of the invention the step of obtaining a thermo isolating jacket additionally comprising selecting the thermo isolating jacket further characterized by: (a) an inner portion fitted by means of size and shape to the external dimensions A of the MRD; (b) volume $V_{0\ Jacket}$ [m]; and (c) volumetric thermal expansion coefficient $\alpha_V$ [° C.$^{-1}$] substantially different than 0; such that if dT substantially different than 0; the volume $V_{0,\ Jacket}$ will be varied to $V_{1,\ Jacket}$, such that the following formula is being held true for any change in temperature, dT;

$$\alpha_V = \frac{1}{V}\left(\frac{\partial V}{\partial T}\right)$$

where dV equals $V_{1,\ Jacket}-V_{0,Jacket}$ and dT equals $T_2-T_1$.

Still referring to FIG. 16, according to another embodiment the step of obtaining a thermo isolating jacket additionally comprising selecting the thermo isolating jacket further characterized by: (a) an inner portion fitted by means of size and shape to the external dimensions A of the MRD; (b) area $A_{0,\ Jacket}$ [m²]; (c) and area thermal expansion coefficient $\alpha_A$ [° C.$^{-1}$] substantially different than 0; such that if dT substantially different than 0; the length $A_{0,\ Jacket}$ will be varied to $A_{1,\ Jacket}$, such that the following formula is being held true for any change in temperature, dT:

$$\alpha_A = \frac{1}{A}\frac{dA}{dT}$$

where dA equals $A_{1,\ Jacket}-A_{0,Jacket}$ and dT equals $T_2-T_1$.

Still referring to FIG. 16, the next step is operating the thermo isolating jacket on an MRD (820). In operating the thermo isolating jacket a user can install or connect the jacket to the MRD. In an embodiment this is achieved by methods such as: placing the thermo isolating jacket as a cover, encasing the MRD, inserting the MRD into a sleeve like structure, connecting two or more parts of the thermo isolating jacket around the MRD, etc. In an embodiment providing a fastener, attaching the MRD to the thermo isolating jacket, and/or to secure the integrity of the thermo isolating jacket parts. In an embodiment this step additionally comprises connecting third party elements such as power supply, active temperature regulating system. In an embodiment this step additionally comprises opening a door of am MRD opening in the thermo isolating jacket in order to gain access to the MRD after installing the thermo isolating jacket, etc. The following step is to image (830) the patient while thermo regulating the MRD.

Still referring to FIG. 16, according to another embodiment of the invention the step of obtaining a thermo isolating jacket additionally comprising selecting a thermo regulating jacket in which at least a portion is constructed of n layers.

Still referring to FIG. 16, according to another embodiment of the invention the step of obtaining a thermo isolating jacket additionally comprising selecting at least 2 of the n layers comprising a substantially different thermal expansion coefficient for each layer; where each of the layers has at least one first temperature H, [° C.] measured on the outer side of the layer, and at least one first temperature $H_2$ [° C.], measured on its inner side towards the MRD, having a $dH_1$-... $dHn$, where dT of thermo isolating jacket equals $H_1$-Hn.

According to another embodiment of the invention, method as defined above is disclosed, additionally comprising a step of selecting the thermo isolating jacket having at least one opening to permit access to the MRD.

According to another embodiment of the invention, method as defined above is disclosed, additionally comprising a step of selecting the thermo isolating jacket in which at least a portion is made with a material selected from a group consisting of: thermo insulating material, sealing material, foam material, fire retardant materials, at least partially transparent material and any combination thereof.

According to another embodiment of the invention, method as defined above is disclosed, additionally comprising a step of selecting the thermo isolating jacket in which at least a portion of having shielding selected from a group consisting of: magnetic shielding, RF shielding, physical shielding and any combination thereof.

According to another embodiment of the invention, method as defined above is disclosed, additionally comprising a step of selecting the thermo isolating jacket having a conduit attenuating the passage of frequencies selected from a group consisting of: 0 to about 1000 MHz, 0 to about 500 MHz, 0 to about 200 MHz and any combination thereof. Further the conduit is sized and shaped to permit passing of tubing from the MRD to the external environment.

According to another embodiment of the invention, method as defined above is disclosed, additionally comprising a step of the conduit attenuating electromagnetic interference by means selected from a group consisting of: waveguide, RF filter, waveguide filter, attenuating material, and any combination thereof.

According to another embodiment of the invention, method as defined above is disclosed, additionally comprising a step of selecting a thermo isolating jacket having at least a portion of electro-conductive material.

According to another embodiment of the invention, method as defined above is disclosed, additionally comprising a step of closing with at least a portion of the jacket, a conductive circuit around the MRD.

According to another embodiment of the invention, method as defined above is disclosed, additionally comprising a step of connecting the jacket to an operating system of the MRD.

According to another embodiment of the invention, method as defined above is disclosed, additionally comprising a step of assembling the jacket from modular pieces reversibly connecting to form the thermo isolating jacket.

According to another embodiment of the invention, method as defined above is disclosed, additionally comprising a step of securing a selected from a group consisting of: a connection between the MRD and the thermo isolating jacket, structural integrity of the thermo isolating jacket, and any combination thereof, with at least one fastener.

According to another embodiment of the invention, method as defined above is disclosed, additionally comprising a step of selecting the thermo isolating jacket in which at least a portion harbors channels for passing of a substance selected from a group consisting of: gas, liquid, or any combination thereof.

According to another embodiment of the invention, method as defined above is disclosed, additionally comprising a step of selecting the thermo isolating jacket in which at least a portion has an active thermo regulating system.

According to another embodiment of the invention, method as defined above is disclosed, additionally comprising a step of operating an active thermo regulating system, thereby heating or cooling the MRD.

According to another embodiment of the invention, method as defined above is disclosed, additionally comprising a step of configuring the to a setting selected from a group consisting of: maintain a predetermined temperature, operate only when a predetermined temperature has been measured within the inner volume, respond to temperature changes in the external environment, operate only within a predetermined temperature range, shut down at a predetermined temperature and any combination thereof.

According to another embodiment of the invention, method as defined above is disclosed, additionally comprising a step of selecting the thermo isolating jacket in which at least a portion of the jacket having a passive thermo-regulating envelope surrounding an active thermo-regulating system.

According to another embodiment of the invention, method as defined above is disclosed, additionally comprising a step of selecting the thermo isolating jacket having at least one sensor selected from a group consisting of: temperature sensors, EMI sensors, magnetic sensors, vibration sensors, connection sensors, and any combination thereof.

According to another embodiment of the invention, method as defined above is disclosed, additionally comprising a step of configuring the sensors to sense the inner volume temperature, the external environment temperature or both.

According to another embodiment of the invention, method as defined above is disclosed, additionally comprising a step of connecting the thermo isolating jacket to a component selected from a group consisting of: a CPU, an alarm system, at least one indicator, at least one sensor, and any combination thereof.

According to another embodiment of the invention, method as defined above is disclosed, additionally comprising a step of connecting at least a portion of the thermo isolating jacket to a user interface.

Figure 17:
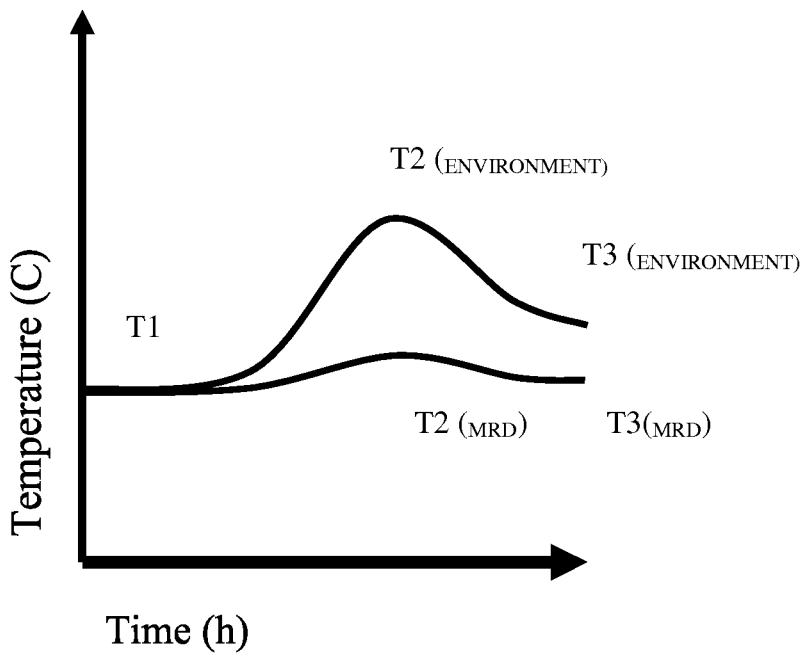
FIG. 17 is a schematic diagram demonstrating the temperature of the environment and the MRD accommodated in a thermo isolating jacket as a function of time.

Reference is now made to FIG. 17 schematically illustrating, in an out of scale manner, a schematic diagram demonstrating the temperature of the environment and the MRD accommodated in a thermo isolating jacket as a function of time. It is demonstrated that as the environment temperature rises T1>T2 ($_{ENVIRONMENT}$) the temperature of the MRD accommodated within the thermo isolating jacket rises only to T2 ($_{MRD}$)<T2 ($_{ENVIRONMENT}$).

Figure 18:
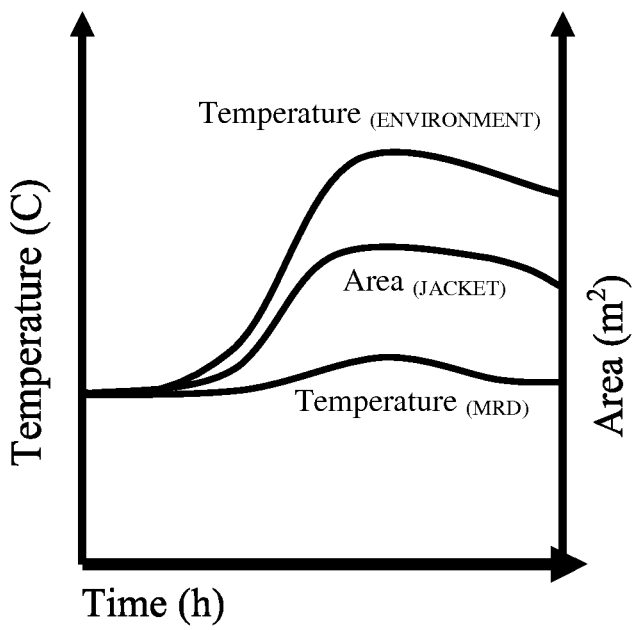
FIG. 18 is a schematic diagram demonstrating the temperature of the environment and the MRD accommodated in a thermo isolating jacket as a function of time, and the thermal area expansion of a thermo-isolating jacket during this time rage.

Reference is now made to FIG. 18 schematically illustrating, in an out of scale manner, a schematic diagram demonstrating the temperature of the environment and the MRD accommodated in a thermo isolating jacket as a function of time, and the thermal area expansion of a thermo-isolating jacket during this time rage. As demonstrated the area (m²) of the MRD rises as the temperature of the environment rises, so that the temperature of the MRD accommodated in the thermo-isolating jacket remains relatively stable.

Figure 19:
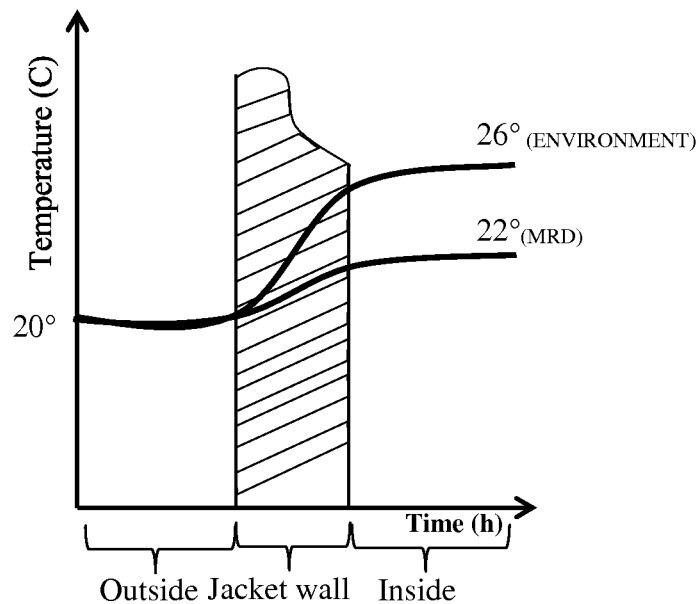
FIG. 19 is a schematic diagram demonstrating the temperature across one section of the thermo isolating jacket.

Reference is now made to FIG. 19 schematically illustrating, in an out of scale manner, a schematic diagram demonstrating the temperature across one section of the thermo isolating jacket; It is demonstrated that as the environment temperature rises to e.g. 26° C., the temperature of the MRD accommodated within the thermo isolating jacket is e.g. 22° C.

Figure 20:
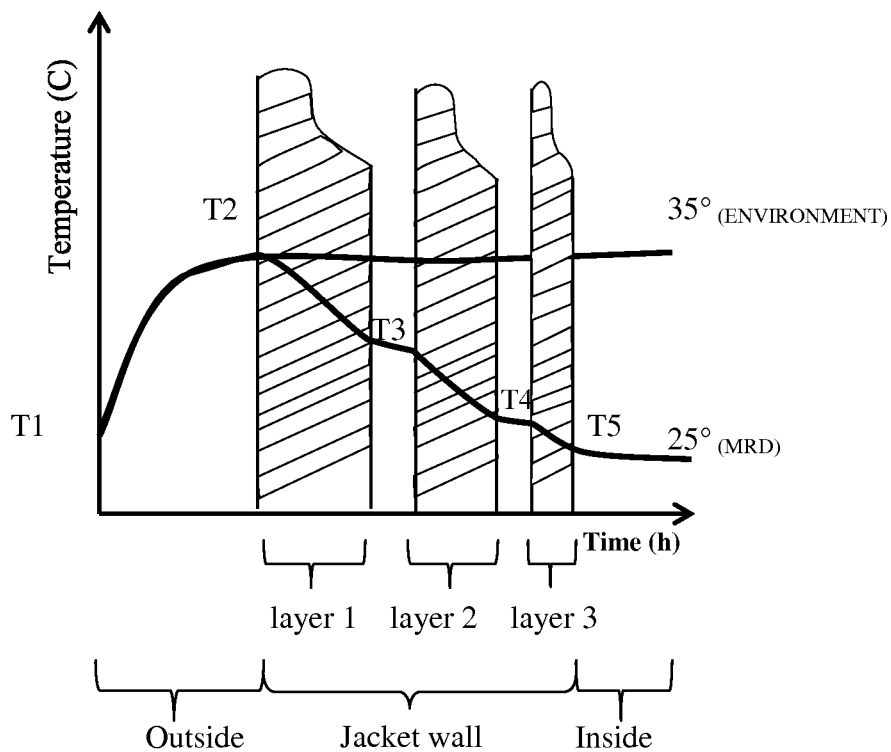
FIG. 20 is a schematic diagram demonstrating the temperature across a section of a layered embodiment of the thermo isolating jacket.

Reference is now made to FIG. 20 schematically illustrating, in an out of scale manner, a schematic diagram demonstrating the temperature across a section of a layered embodiment of the thermo isolating jacket; It is demonstrated that as the temperature of the environment rises the temperature within the different layers of the thermo-isolating jacket. For example it is shown that T2>T3>T4>T5; e.g. T2=35° C., T5=25° C.

What is claimed is:

1. A thermal isolating jacket for a magnetic resonance device (MRD), configured to be positioned in an atmospheric pressure system, temperature changing environment, having at least one first temperature $T_1$ [° C.] and a Q [kj] amount of heat applied to the same, in which:
    a. an inner portion fitted by means of size and shape to the external dimensions of said MRD;
    b. at least one second temperature $T_2$ [° C.] in said inner portion;
    c. a specific mass, m [kg]; and,
    d. specific heat capacity, $C_p$ [kj/kg];
wherein the following formula is being held true:

$$Q=C_p m dT; \text{ where } dT=T_1-T_2,$$

wherein for each applied Q, dT2 is in the range of 0° C.-0.2° C.; where $dT_2=T_2+dT$.

2. The thermal isolating jacket according to claim 1, wherein at least a portion of said jacket comprising n layers.

3. The thermal isolating jacket according to claim 2, wherein at least 2 of said n layers comprising a substantially different specific heat capacity $C_p$ for each layer; where each of said layers has at least one first temperature $H_1$ [° C.] measured on the outer side of said layer, and at least one first temperature $H_2$ [° C.], measured on its inner side towards said MRD, having a $dH_1$- . . . dHn, where dT of thermo isolating jacket equals $H_1$–Hn.

4. The thermo isolating jacket according to claim 1, wherein said jacket comprising at least one opening to permit access to said MRD.

5. The thermo isolating jacket according to claim 1, wherein at least a portion of said thermo isolating jacket comprising a material selected from a group consisting of: thermo insulating material, sealing material, foam material, fire retardant materials, at least partially transparent material and any combination thereof.

6. The thermo isolating jacket according to claim 1, wherein at least a portion of said thermo isolating jacket comprises means for shielding at least a portion of said MRD from a selected from a group consisting of: magnetism, electromagnetic interference, physical damage and any combination thereof.

7. A method for thermo-regulating an magnetic resonance device (MRD), configured to be positioned in an atmospheric pressure system and temperature changing environment, having at least one first temperature $T_1$ [° C.] and a Q [kj] amount of heat applied to the same, comprising steps of:
    a. obtaining a thermal isolating jacket for an MRD, in which i. an inner portion fitted by means of size and shape to the external dimensions of said MRD; ii. at least one second temperature $T_2$ [° C.] in said inner portion; iii. a specific mass, m [kg]; and iv. specific heat capacity, $C_p$ [kj/kg]; and,
    b. operating the same;
wherein said step of obtaining said thermal isolating jacket such that the following formula is held true:

$$Q=C_p m dT; \text{ where } dT=T_1-T_2,$$

wherein for each applied Q, dT2 is in the range of 0° C.-0.2° C.; where $dT_2=T_2+dT$.

* * * * *